US010003000B2

(12) United States Patent
Imran et al.

(10) Patent No.: US 10,003,000 B2
(45) Date of Patent: Jun. 19, 2018

(54) SYSTEM FOR THERMOELECTRIC ENERGY GENERATION

(71) Applicant: InCube Labs, LLC, San Jose, CA (US)

(72) Inventors: Mir Imran, Los Altos Hills, CA (US); Matthew Harrison, San Jose, CA (US); Brent Nowak, San Jose, CA (US); Cody Lee, San Jose, CA (US)

(73) Assignee: InCube Labs, LLC, San Jose, CA (US)

( * ) Notice: Subject to any disclaimer, the term of this patent is extended or adjusted under 35 U.S.C. 154(b) by 511 days.

(21) Appl. No.: 13/940,109

(22) Filed: Jul. 11, 2013

(65) Prior Publication Data

US 2014/0020730 A1    Jan. 23, 2014

Related U.S. Application Data

(63) Continuation-in-part of application No. 13/586,828, filed on Aug. 15, 2012.

(Continued)

(51) Int. Cl.
*H01L 35/30* (2006.01)
*H01L 35/00* (2006.01)
(Continued)

(52) U.S. Cl.
CPC .............. *H01L 35/30* (2013.01); *F01K 25/02* (2013.01); *F28D 15/02* (2013.01); *H01L 35/00* (2013.01);
(Continued)

(58) Field of Classification Search
CPC ..................... H01L 35/30; H01L 35/00; F23C 2900/03001; F23M 2900/13003; Y02T 10/166
See application file for complete search history.

(56) References Cited

U.S. PATENT DOCUMENTS 4,434,613 A * 3/1984 Stahl .................. B01J 12/005
60/39.182
4,734,139 A * 3/1988 Shakun ................ H01L 35/30
136/205

(Continued)

FOREIGN PATENT DOCUMENTS

EP        1255340      11/2004
GB        2402001 A    11/2004
(Continued)

OTHER PUBLICATIONS

Qiu et al. "Development of a thermoelectric self-powered residential heating system", Journal of Power Sources, Elsevier SA, CH, vol. 180, No. 2, Jun. 1, 2008.

(Continued)

*Primary Examiner* — Mark Laurenzi
*Assistant Examiner* — Wesley Harris
(74) *Attorney, Agent, or Firm* — Mahamedi IP Law LLP; Joel Harris

(57) ABSTRACT

Embodiments of the invention provide systems and methods for generating and delivering electricity and/or hot water for combined heat and power (CHP) using one or more fuels. In many embodiments, the system can be used to provide efficient electrical, heating and cooling utilities to a residential household or group of households. Embodiments of the system can be configured for specific heat flow, while minimizing losses and maximizing total system efficiency. Embodiments also provide for stackable energy generation modules allowing the system to be placed in or nearby a residence to provide power to the residence. Embodiments also provide a control system which can be configured to monitor household electrical usage and dynamically regulate the system to operate at maximum efficiency as well as sell power to an external grid.

25 Claims, 18 Drawing Sheets

Related U.S. Application Data

(60) Provisional application No. 61/670,558, filed on Jul. 11, 2012, provisional application No. 61/523,828, filed on Aug. 15, 2011.

(51) Int. Cl.
  *F01K 25/02* (2006.01)
  *F28D 15/02* (2006.01)

(52) U.S. Cl.
  CPC .............. *F23C 2900/03001* (2013.01); *F23M 2900/13003* (2013.01); *Y02E 20/14* (2013.01); *Y02T 10/166* (2013.01)

(56) References Cited

U.S. PATENT DOCUMENTS

| | | |
|---|---|---|
| 6,192,687 B1 | 2/2001 | Pinkerton et al. |
| 6,198,038 B1* | 3/2001 | Shukla ................ F23C 3/002 |
| | | 136/205 |
| 6,236,810 B1* | 5/2001 | Kadotani ............ F25B 21/02 |
| | | 392/483 |
| 6,987,329 B1 | 1/2006 | Smith et al. |
| 7,317,265 B2 | 1/2008 | Chain et al. |
| 7,493,766 B2 | 2/2009 | Yang et al. |
| 2004/0089336 A1 | 5/2004 | Hunt |
| 2004/0099304 A1* | 5/2004 | Cox .................... B60L 11/00 |
| | | 136/253 |
| 2006/0066106 A1* | 3/2006 | Yang ................... F23C 13/00 |
| | | 290/1 A |
| 2007/0044468 A1* | 3/2007 | Ziph .................... F02G 1/043 |
| | | 60/520 |
| 2007/0261729 A1 | 11/2007 | Hu |
| 2008/0078434 A1 | 4/2008 | Chakraborty |
| 2009/0007953 A1* | 1/2009 | Hsu .................... F23C 13/00 |
| | | 136/205 |
| 2009/0301539 A1* | 12/2009 | Watts ................... H01L 35/00 |
| | | 136/201 |
| 2009/0301687 A1* | 12/2009 | Watts ................... H01L 35/00 |
| | | 165/48.2 |
| 2011/0067742 A1 | 3/2011 | Bell |
| 2011/0077811 A1 | 3/2011 | Karimi et al. |

FOREIGN PATENT DOCUMENTS

| | | |
|---|---|---|
| JP | 2003-235158 | 2/2002 |
| JP | 2009-267316 | 11/2009 |
| WO | WO 2010/089505 | 8/2010 |

OTHER PUBLICATIONS

Qiu et al. "A Natural-Gas-Fired Thermoelectric Power Generation System", Journal of Electronic Materials, vol. 38, No. 7, Jul. 1, 2009.
Supplemental EP Search Report and Notice thereof dated Nov. 17, 2014 in EP Application No. 12823819.3.
Office Action in JP2014-526188 dated May 31, 2016.

* cited by examiner

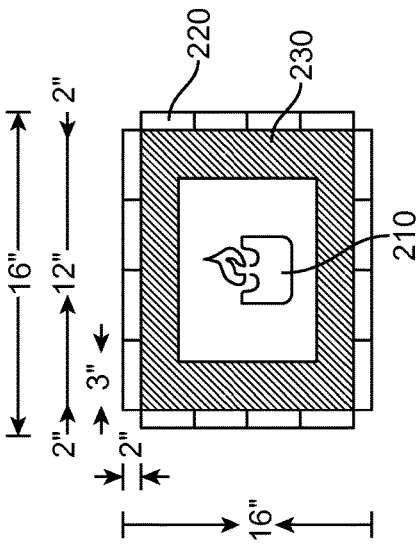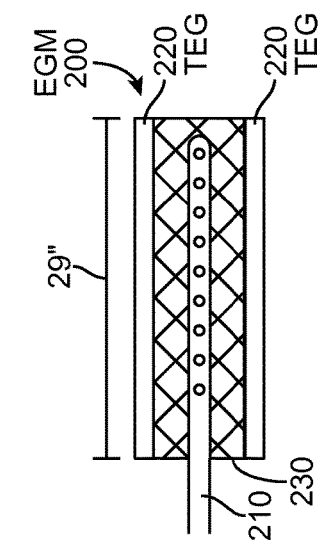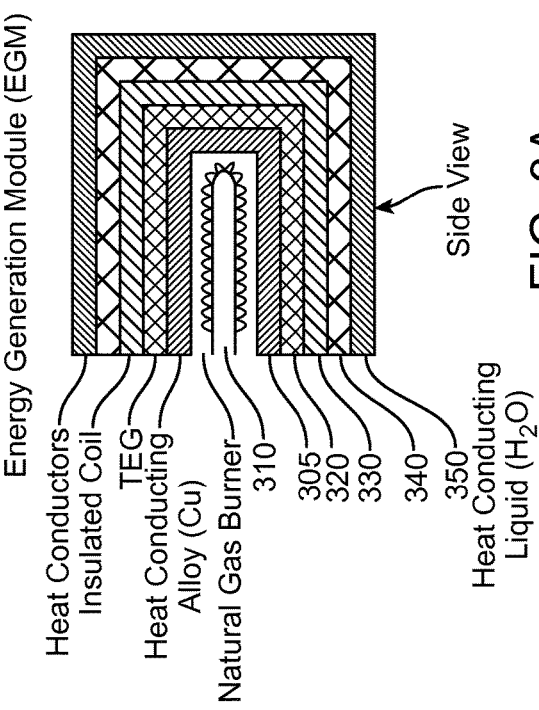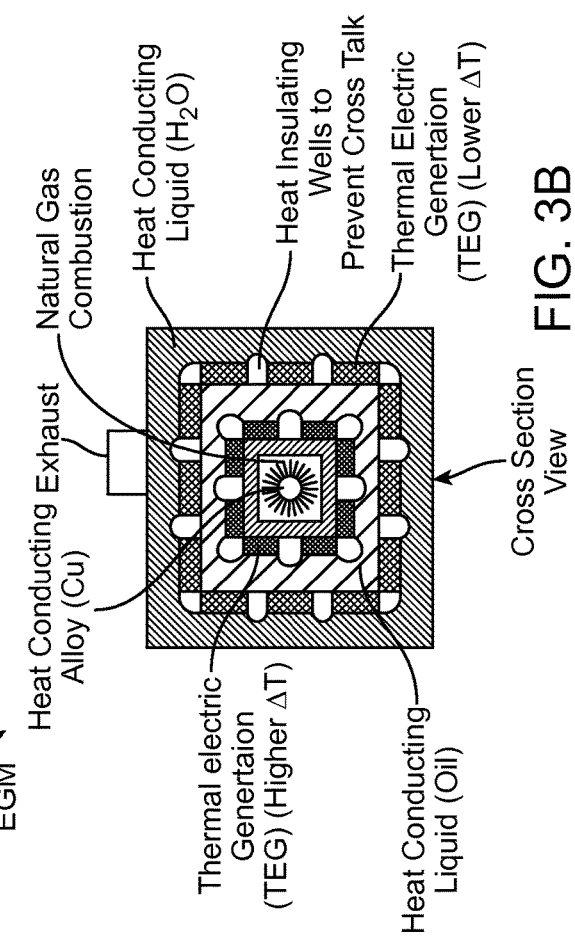

SYSTEM FOR THERMOELECTRIC ENERGY GENERATION

RELATED APPLICATIONS

This application claims the benefit of priority to Provisional U.S. Patent Application No. 61/670,558, entitled "System for Thermoelectric Energy Generation", filed Jul. 11, 2012; this application is also a Continuation-In-Part of U.S. patent application Ser. No. 13/586,828 entitled "System and Method for Thermoelectric Energy Generation", filed Aug. 15, 2012, which claims the benefit of priority to Provisional U.S. Patent Application No. 61/523,828, entitled "System and Method for Thermoelectric Energy Generation", filed Aug. 15, 2011; all of the aforementioned priority applications are hereby incorporated by reference for all purposes.

TECHNICAL FIELD

Embodiments described herein relate to energy generation. More particularly, embodiments described herein related to a system and a method for generating electricity from a heat source. Still more particularly, embodiments described herein related to a system and a method for controlling electricity generation from a heat source.

BACKGROUND

Thermal energy is one of the most common forms of energy existing in nature and may result from processes such as combustion. Heat is a form of thermal energy which results from the transfer of thermal energy from a system having a higher temperature to a system having a lower temperature. Thermoelectric generators (TEGs), or thermoelectric devices, are devices that are capable of directly converting heat into electricity. TEG modules, which can be in the form of a strip, can be attached to stoves, fireplaces, or furnaces to harvest thermal energy for providing electricity as a supplement or an alternative source. Current TEG strips have somewhat helped to alleviate wasted heat by converting the wasted heat into electricity; however, current applications of TEGs are rudimentary and not fully effective. Their efficiency is subject to various environmental settings.

In North America, it is common to use natural gas to generate hot water and/or hot air for domestic uses. In fact, nearly 70% of single family homes use natural gas for heating purposes. Besides being abundant, natural gas has an advantage over petroleum or coal, as natural gas burns cleanly without producing harmful chemicals like sulfur dioxide or nitrogen oxide into the air. Although natural gas and electricity in a given local area are regularly provided by the same energy company, they are typically sold and delivered to households as two separate products using two separate delivery infrastructures (e.g., power lines vs. gas lines). The inability of end customers to easily convert one product into another, results in economic and engineering inefficiencies. Therefore, it is beneficial to enable a user to selectively generate electricity from a controllable heat source.

BRIEF DESCRIPTION OF THE DRAWINGS

Embodiments are illustrated by way of example, and not by way of limitation, in the figures of the accompanying drawings and in which like reference numerals refer to similar elements and in which:

FIG. 2A illustrates a side view of one embodiment of an energy generation module;

FIG. 2B illustrates a cross sectional view of the embodiment shown in FIG. 2A;

FIG. 3A illustrates a side view of another embodiment of an energy generation module;

FIG. 3B illustrates a cross sectional view of the embodiment shown in FIG. 3A;

DETAILED DESCRIPTION

Figure 1:
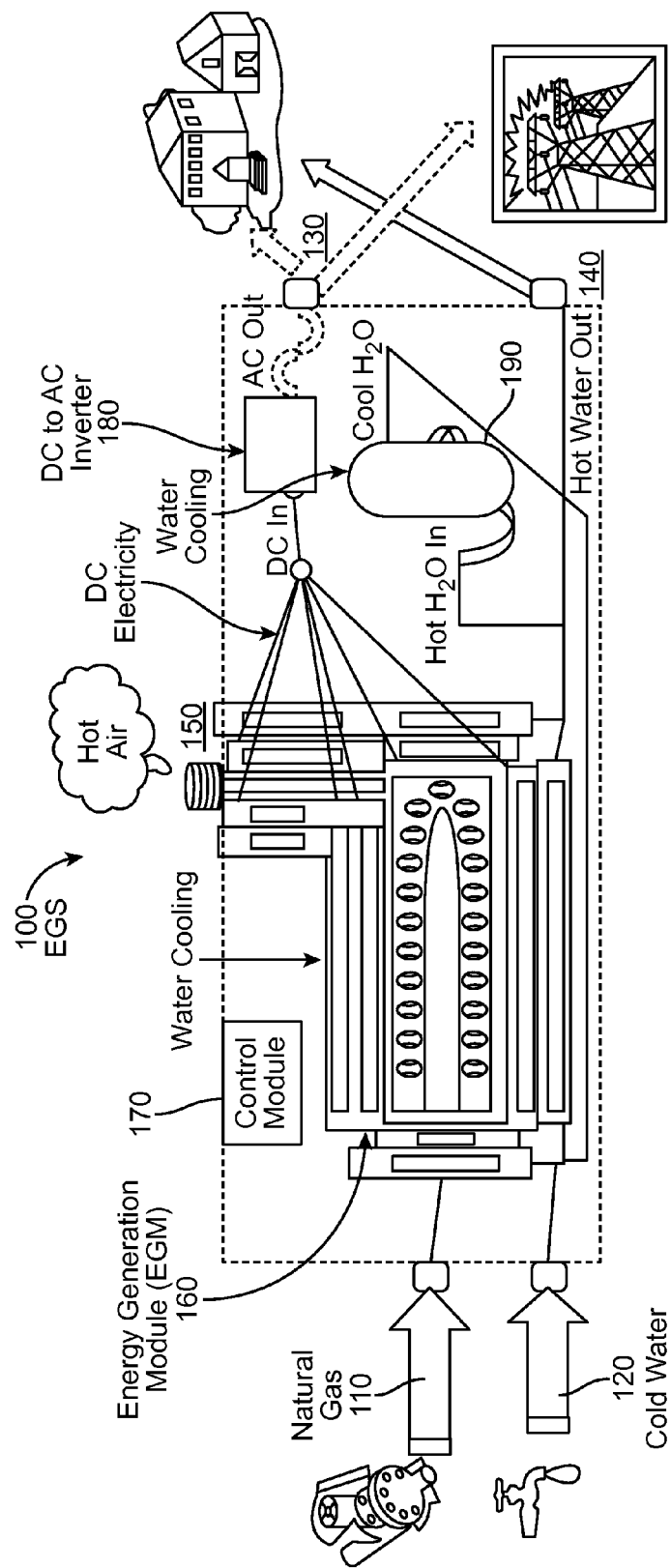
FIG. 1 illustrates one embodiment of an energy generation system.

Various embodiments disclosed herein provide for the use of a controllable heat source to generate electricity. Many embodiments provide an energy generation module comprising a controllable heat source, one or more jackets of thermoelectric devices, and heat conducting fluids. The fluids may be configured and positioned to conduct heat from and/or to the jackets and may be placed to surround all or a portion of the jackets and/or to lie in between the jackets. According to various embodiments, the energy generation module can be used to convert heat, for example, from a gas combustion chamber (also described herein as a combustor), into electricity. In particular embodiments, the energy generation system can have one or more energy generation modules, a direct current to alternating current (DC to AC) converter, and a control module to selectively generate electricity based, at least in part, on load demand and a supply condition(s) of the local power grid. According to yet another embodiment, a method for generating electricity using an energy generation system having a plurality of energy generation modules with controllable heat sources is disclosed to selectively generate electricity based at least in part on information about load demand and a supply condition of the local power grid. The information on load demand can include one or more of the following parameters: current load demand, a rate of change of load demand, a moving average of the load demand, a time averaged load demand over a select time period, a comparison of current load demand to historical load demand (e.g., for a given hour, a given week day, a calendar day, etc.), wherein the comparison can be a ratio, a weighted ratio, a derivative and/or integration function. Further, any one of the preceding parameters of load demand can be for the user's household, a local power grid (e.g., a neighborhood, city or the like) or a larger regional power grid (e.g., a metropolitan area, county, state, region or larger). Similarly, the information on the supply condition can include or more of the following parameters: a current supply condition, a rate of change of the supply condition, a moving average of the supply condition, a time averaged supply condition over a select time period (e.g., over an hour, day, week, month, or year), a comparison of the current supply condition to a historical supply condition (e.g., for a given hour, a given day, a calendar day, a given week, etc.), where the comparison can be a ratio, a weighted ratio, a derivative and/or integration function. As similarly described above for load demand, the parameters of the supply condition can be for the user's household, a local power grid (e.g., a neighborhood, city or the like) or a larger regional power grid (e.g., a metropolitan area, county, state, region or larger).

Still further, some embodiments described herein are configured to enable a user, such as an individual home owner, to generate electricity with high efficiency from a controllable heat source, for example, a natural gas combustor. In the following description, numerous specific details are set forth in order to provide a thorough understanding of the embodiments. However, it will be appreciated that these embodiments may be practiced without these specific details. In other instances, well-known structures and devices are shown in block diagram form to avoid unnecessarily obscuring the exemplary embodiments described herein.

FIG. 1 illustrates one embodiment of an energy generation system 100. The energy generation system 100 includes a natural gas input 110, a cold water input 120, an electricity output 130, a hot water output 140, and an exhaust output 150. The energy generation system 100 also includes one or more thermoelectric energy generation modules (EGMs) 160, a control module 170, a DC-to-AC converter 180, and water cooler 190. The one or more EGMs can be coupled to the natural gas input 110 and the cold water input 120. According to one or more embodiments, the energy generation system 100 can be configured to control the one or more EGMs 160 to convert heat from a controllable heat source (for example, by burning the natural gas supplied by the natural gas input 110) into electricity.

According to various embodiments, the EGM(s) 160 are coupled to the natural gas input 110 for fuel gas, and to the cold water input 120 for coolant. According to one embodiment, the EGM 160 includes a controllable heat source, at least a first jacket of thermoelectric devices (or TEGs) and at least a first heat conducting fluid contacting all or a portion of the outer side of the first jacket to create a temperature difference or gradient ($\Delta T$) over a portion of the jacket of thermoelectric devices. Typically, the temperature gradient will be between the inside wall of the jacket (the hot side) and the outside wall (the cool side). However, other configurations to create the temperature gradient ($\Delta T$) are also contemplated (e.g., inside wall is the cool side, the outside wall is the cool side, etc.). Through the thermoelectric effect, the $\Delta T$ creates a voltage difference in the TEGs, and thereby the EGM 160 converts heat into electricity. The heat conducting fluid can be any kind of fluid capable of heat conducting well known in the art, for example, oil or water. In specific embodiments, the heat transfer fluids can include one or more of the following solutions: brine/salt solution (including molten salt solutions), ethylene glycol based solutions, propylene glycol based solutions, and polyalkylene glycol based solutions (examples including UCON Heat Transfer fluids 500 and 50-HB-260-Y3). In particular embodiments, the heat conducting solution (including its operating range and heat capacity) can be selected based on one or more of the following: the combustion temperature, the temperature gradient ($\Delta T$), the temperature on the outside of the TEG, the amount or rate of heat generation by the combustor, and/or the desired rate of cooling of the cool side (of the TEG). Also, the heat conducting fluid (as well as a heat conducting material described herein) can surround all or a portion of the outside wall of the jacket. In various embodiments, the heat conductive fluid (and/or the heat conductive material) can be in direct contact with the jacket or otherwise thermally coupled to the jacket through indirect contact (e.g., via another thermally conductive material or structure) to allow for heat transfer to the heat conducting fluid. The other thermally conductive fluid can include a second heat conductive fluid, while the thermally conductive structure can include for example, a heat exchanger such as a shell and tube heat exchanger or other heat exchanger known in the art which may use the second heat conductive fluid. The controllable heat source can selectively generate heat in response to a control signal. Such a control signal may be transmitted from the control module 170 of the energy control system 100. Structures of the embodiments of the EGM 160 are described in fuller detail below.

In the course of energy conversion, cold water supplied by the cold water input 120, may be used at least in part for the coolant for the EGMs. Hot water is produced as a by-product of the conversion, and may be directed either to the hot water output 140 for further use, or to the water cooler 190 to be cooled and redirected to the EGM 160 for reuse as coolant. The water cooler 190 can be any kind of suitable cooler including, for example, a compressor driven cooler such as those used in refrigeration units. In some embodiments, the exhaust, as another by-product of the conversion, may be directed to the exhaust output 150 to be released into the atmosphere. In other embodiments, the exhaust can be used as a heat source for heating purposes, for example, for heating hot water. In still other embodiments carbon dioxide ($CO_2$) from the exhaust can be filtered out using for example, lithium hydroxide or other $CO_2$-sorbent material known in the art such as various zeolite materials. In various embodiments, system 100 may include one or more $CO_2$ monitors in the exhaust output to monitor the amount of $CO_2$ vented to the atmosphere. The $CO_2$ monitoring process can be used for one or more of the following purposes: $CO_2$ cap and trade, modifying a parameter of the combustion process (e.g., fuel to air ratio) to reduce the amount of $CO_2$, or to divert the exhaust stream through a $CO_2$ absorbing material and/or enable a $CO_2$ absorbing process or module.

In many embodiments, the main product of the energy conversion is electricity, which typically is in the form of direct current (though in some embodiments, it may be in the form of alternating current). The electricity is directed from the EGM 160 to the DC-to-AC converter 180 (which is electrically coupled to EGM 160) to become alternating current, and is then directed to the electricity output 130. In some other embodiments, the direct current can be directed to the electricity output 130, and the DC-to-AC converter 180 can be omitted. Additionally, other electrical devices 180 can be employed to modify electricity output 130. Such electrical devices can include for example, a transformer to step up or step down the voltage of output 130 for power transmission to a local power grid (e.g., up to 10 to 20 miles away) or a remote power grid (e.g., hundreds of miles away) with the step up or step down adjusted accordingly.

FIG. 2A illustrates a side view of one embodiment 200 of an energy generation module (EGM). The EGM 200 can include a controllable heat source 210, a plurality of thermoelectric generators (TEGs) 220, and a heat conducting layer 230. The controllable heat source 210 can burn natural gas as fuel to create heat. The heat conducting layer 230 may be placed in proximity to the controllable heat source 210 so as to at least partially surround the heat source 210, so that the heat from the controllable heat source 210 is efficiently transferred to the heat conducting layer 230. The heat conducting layer 230 can be filled with a heat conducting fluid, like oil or water (that can be sealed within layer 230), or can simply be a heat conducting material, (for example, copper or other heat conducting metal) or can include a combination of heat conductive fluid and heat conducting material. In particular embodiments, the heat conducting layer 230 can have a corrugated or other textured surface so as to increase the surface area of layer 230 and thus, the amount/rate of heat transfer. The plurality of TEGs 220 may form a jacket to surround all or a portion of the heat conducting layer 230, so that the inner side of the jacket of TEGs are heated. The TEGs can be linked together in the jacket by various metals, polymers or carbon fiber materials which can be rigid or flexible. The materials which link the TEGs together are heat tolerant and may also be thermally insulating to prevent thermal cross talk between TEGs as discussed in further detail herein. Alternatively, the linking materials may have a selected amount of thermal conductivity. The jacket can be pre-formed to have a specific shape or may comprise flexible materials allowing it to be shaped as desired. The heated inner side of the jacket of TEGs and the outer cooler side of the jacket of TEGs result in a temperature difference or gradient ($\Delta T$), which can be used to drive the TEGs to generate electricity. Also, the plurality of TEGs 220 can be symmetrically distributed around the perimeter of heat conducting layer 230 and/or heat source 210. Various asymmetric distributions are also considered. Also in various embodiments, TEGs 220 can be distributed in a pattern whereby they are separated by thermally insulating wells as is discussed in greater detail herein.

FIG. 2B illustrates a cross section view of the embodiment 200 shown in FIG. 2A. As illustrated in FIG. 2A, the heat conducting layer 220 and the jacket of the plurality of TEGs 230 are placed in proximity to the controllable heat source 210 so as to at least partially surround the heat source 210 for better conversion efficiency.

FIG. 3A illustrates a side view of another embodiment 300 of an energy generation module (EGM). In this and related embodiments, the EGM 300 can include a controllable heat source 310, a first jacket of thermoelectric devices (TEGs) 320, a first heat conducting fluid 330, and optionally, a heat source housing 305. In some embodiments, the EGM 300 further includes a second jacket of TEGs 340, and a second heat conducting fluid 350 as is explained in more detail below. Still further, the controllable heat source 310 can selectively generate heat in response to a control signal, which may be generated by a control module such as control module 160 in FIG. 1.

The first jacket of TEGs 320 has an inner side and an outer side. According to one or more embodiments, the inner side of the first jacket 320 is placed in proximity to the controllable heat source 310 so as to at least partially surround the heat source 310 to absorb heat, for example, by conduction or other forms of heat transfer (e.g., convection, etc.). In some embodiments, it may completely surround the heat source. The outer side of the first jacket 320 is surrounded by the first heat conducting fluid 330. The first heat conducting fluid 330 can act as coolant or heat dissipation agent, and thereby create a temperature difference or gradient ($\Delta T$) between the inner and the outer side of the first jacket of TEGs 320, which in turn becomes the source of electricity generation. In one embodiment, the first heat conducting fluid 330 is oil (e.g., a petroleum-based oil, though other oils are considered as well including e.g., various synthetic oils, including silicone based oil). In other embodiments, the first heat conducting fluid 330 is water. Also, various solutes can be added to water (e.g., salt,) to increase its heat capacity.

In some embodiments, the second jacket of TEGs 340 is selected and positioned so as to more completely absorb the heat generated from the controllable heat source 310. In such embodiments, the second jacket of TEGs 340 is placed as enclosure for the first conducting fluid 330 so that the inner side of the second jacket 340 at least partially surrounds the first heat conducting fluid 330 and absorbs heat from fluid 330. The second heat conducting fluid 350 can also be placed to at least partially surround the outer side of the second jacket 340 to cool down the outer side of the second jacket 340 and to create $\Delta T$, so that the second jacket of TEGs 340 further generates electricity. In various embodiments employing a first and a second jacket of TEGs 320 and 340, a series of heat conducting conduits (not shown) can be thermally coupled to one or both of jackets 320 and 340 (either directly or indirectly) so as to concentrate or otherwise enhance heat transfer between jackets 320 and 340. The heat conducting conduits can be used alone or in combination with heat transfer fluid 330. In particular embodiments, the heat conducting conduits can comprise various heat conducting metals known in the art and/or high heat capacity liquids (e.g., oil, water or salt water). In various embodiments, one or both of energy generating jackets 320 and 340 can have a rectangular or a cylindrical shape configured to enhance heat transfer from one or more of: i) heat source 310 to first heat conducting fluid 330 and first jacket 320; ii) first heat conducting fluid 330 and second jacket 340; and iii) between second jacket 340 and second heat conducting fluid 350. Other shapes are also considered for enhancing heat transfer between one or more of the above elements. Additionally, one or both of jackets 320 and 340 can have a corrugated, ribbed or other textured surface (either inside, outside or both) for enhancing heat transfer, for example, to first heat transfer fluid 330, or to second heat transfer fluid 350. Thus, in particular embodiments, one or both of jackets 320 and 340 can have a corrugated or ribbed rectangular or cylindrical shape. The number, shape and depth of the corrugations can be selected to achieve a particular amount of heat transfer and/or conduction coefficient between one or more of first fluid 330 and first jacket 320 as well as second jacket 340 and second fluid 350.

Optionally, the heat source housing 305 can be placed between the first jacket of TEGs 320 and the controllable heat source 310 to protect the inner side of the jacket 320 against carbon accumulation from incomplete and/or inefficient combustion, which may happen when the natural gas (or other fuel) does not burn completely. The heat source in housing 305 can be made of materials with high heat conducting properties (e.g., coefficient of conduction), for example, copper, to ensure high heat transfer efficiency from the heat source 310 to the first jacket 320.

FIG. 3B illustrates a cross sectional view of the embodiment 300 shown in FIG. 3A. As illustrated in FIG. 3A, the optional heat source housing 305, the first jacket of TEGs 320, the first heat conducting fluid 330, the second jacket of TEGs 330, and the second heat conducting fluid 340, are all placed in proximity to the controllable heat source 310 so as to at least partially surround the heat source 310 for better heat-to-electricity conversion efficiency. It should be appreciated for simplicity sake, the proper seals are omitted from FIGS. 3A and 3B; however, a person having ordinary skill in the art will understand that any suitable seals or enclosures with high heat conductivity can be used to properly contain the heat conducting fluids. It should also be appreciated that the number of jackets of TEGs and layers of heat conducting fluids depicted in these and other figures are arbitrary and need not be the same. In some embodiments, the number of jackets is not equal to the number of layers of heat conducting fluids. FIG. 3B also shows a configuration where the TEGs in second jacket 340 are separated by thermally insulated wells to prevent conduction or other thermal cross talk between TEGs which may resulting in a decrease in temperature gradient ΔT.

Figure 4:
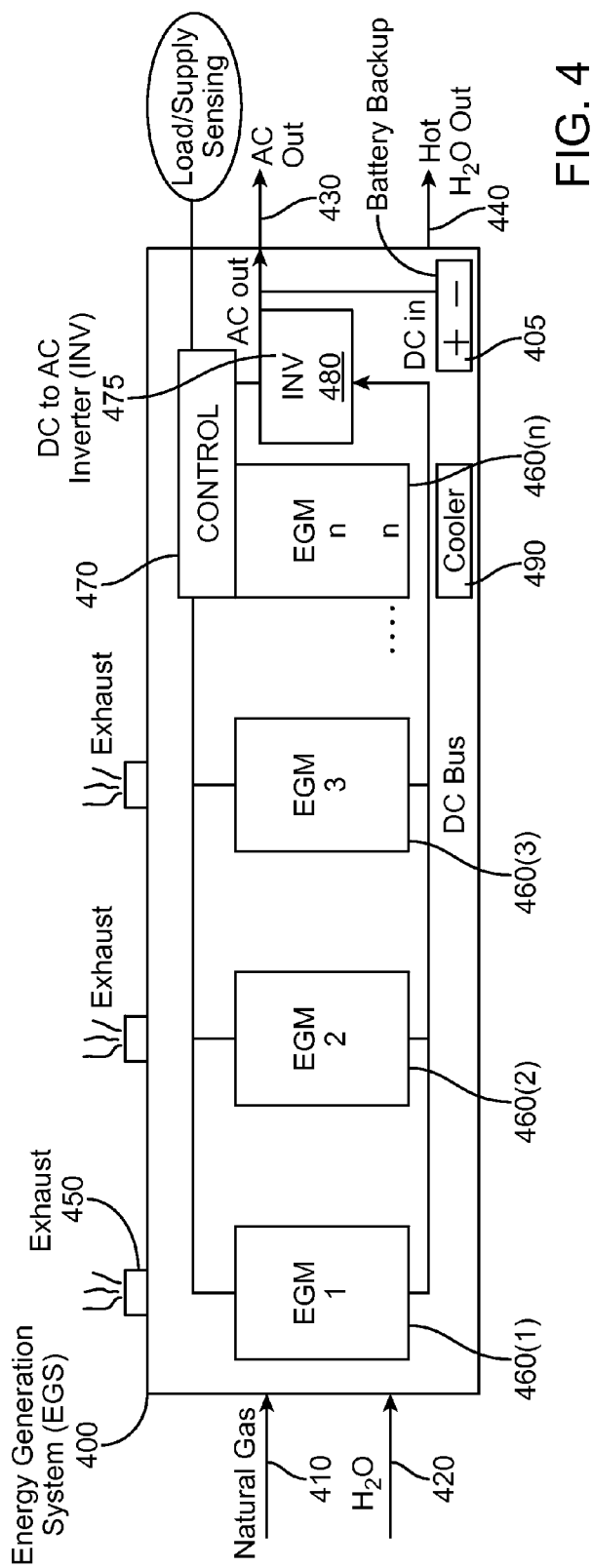
FIG. 4 illustrates a multiple module configuration for an energy generation system, according to one embodiment.

FIG. 4 illustrates a multiple module configuration for an energy generation system (EGS) 400, according to one embodiment. The EGS 400 may include a natural gas input 410, a cold water input 420, an electricity output 430, a hot water output 440, and one or more exhaust outputs 450. The energy generation system 400 may also include a plurality of thermoelectric energy generation modules (EGMs) 460(1)-460(n), a control module 470, a DC-to-AC converter 480, a water cooler 490, and optionally, a battery 405. The plurality of EGMs 460 may be coupled to the natural gas input 410 and the cold water input 420. In an embodiment, the energy generation system 400 can control the plurality of EGMs 460 to convert heat from a controllable heat source, for example, by burning the natural gas supplied by the natural gas input 410, to electricity in a manner similar to the EGS 100 of FIG. 1 described above. The operations of the EGMs 460 are similar to the EGM 160 of FIG. 1, and are not redundantly described herein. However, the operations of the control module 470 are now explained in more detail.

Referring now to FIGS. 1 and 4, the control module 470 may include a load/supply sensing input 475 to monitor load/supply condition, and may be coupled to the controllable heat sources of the plurality of EGMs 460 to transmit control signals. The control module 470 may be configured to (i) monitor at least a load demand of the system and a supply condition of a local power grid; (ii) determine when to generate electricity and at what capacity based on the results of the monitoring; and (iii) adjust one or more heat sources (e.g., by increasing a natural gas flow rate) of the plurality of energy generation modules based on the determination. According to some embodiments, the control module 470 can further monitor the buying prices for natural gas and electricity in making the determination on whether it is economically profitable to generate electricity, and if so, how much electricity is to be generated.

Therefore, when the power supply from the local power grid is not enough (e.g., during summer or during a power outage), the control module 470 is operable to generate electricity. That is to say, the EGS 400 can generate electricity when the load demand of the system is greater than the supply condition of the local power grid, meaning the EGS 400 is operating as a supplemental power source. Furthermore, there are certain times when it makes economic sense for the user to generate his or her own electricity from gas rather than buying electricity from the local power company. Therefore, in some embodiments, the control module 470 is operable to generate electricity when the cost of generating electricity using the EGS 400 is lower than the cost of buying electricity directly from a local or other power company.

Still further, in some places in North America, there are policies of repaying the users if they are to put electricity back onto the local power grid. Therefore, in some embodiments, the control module 470 further monitors a selling price for transmitting electricity back to the local power grid, and the control module 470 is operable to generate electricity when the cost of generation electricity is lower than the selling price for transmitting electricity back to the grid.

In alternative or additional embodiments, the battery 405 can be placed in the EGS 400. The battery 405 can be used for backup and/or power supplement purposes. In specific embodiments, because there is a transition delay in the process from burning natural gas to generate heat, and then in converting the heat into electricity, the battery 405 can be configured to support the electrical power demands put on EGS 400 by users during this transition time. The battery 405 may be charged when the electricity generated from the EGMs 460 is higher than the load demand, and may be configured to release energy when the load demand is higher than the electricity generated from the EGMs 460. For embodiments the EGS 400 having a battery 405, the control module 470 can be further configured to store electricity in the battery (e.g., by directing a charging current to the battery under a charging regimen tailored to the specific battery chemistry, e.g., lead acid, lithium ion, etc.) during a first transition time in which an output from the plurality of energy generation modules is higher than what is designated by the control module, and then to release electricity from the battery during a second transition time in which the output from the plurality of energy generation modules is lower than what is designated by the control module.

Therefore, in one or more embodiments, the EGS 400 with control module 470 can dynamically generate electricity based, at least in part, on load/supply demand 475. The control module 470 can sense load conditions and accurately control energy generation. The control module 470 can control natural gas combustion (e.g., turn it off and on and control the rate) and/or adjust the flow rates of liquid in achieving its electricity generation targets. Advantageously, the EGS 400 can enable a user to efficiently convert natural gas into electricity.

Figure 5:
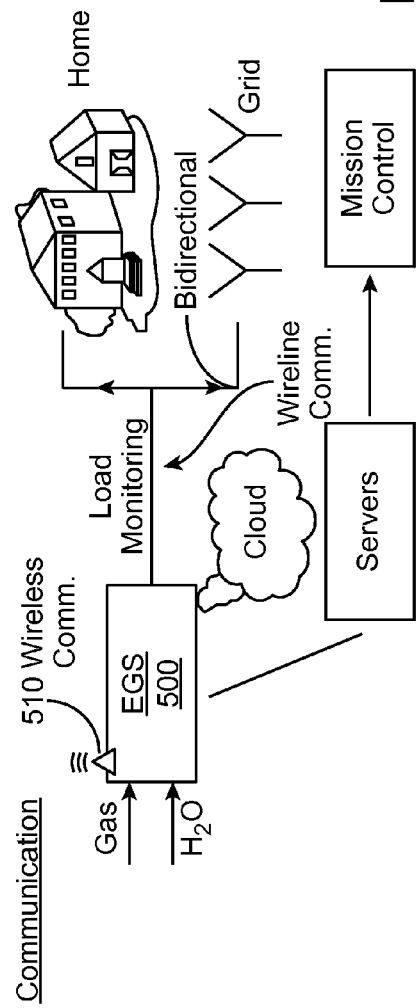
FIG. 5 illustrates an energy generation system with wireless remote control ability, according to embodiments described herein.

FIG. 5 illustrates an embodiment of an energy generation system 500 with wireless remote control ability, according to embodiments described herein. The EGS 500 is essentially the same as the EGS 400 of FIG. 4, except that the EGS 500 is equipped with a wireless communication circuit 510 coupled to its control module (not shown). With the wireless communication circuit 510, the control module can receive remote control commands to make adjustment to energy generation operations. The remote control commands can come from a centralized mission control, or other suitable sources including, for example, a user's personal digital assistance (PDA), personal computer, laptop, or a smart phone.

Figure 6:
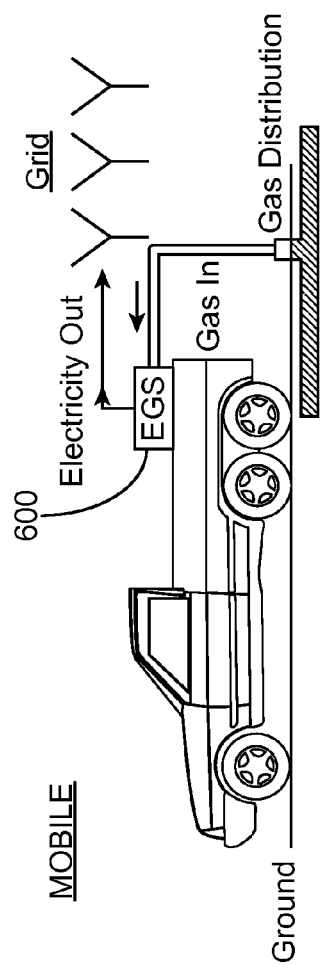
FIG. 6 illustrates a mobile application of an energy generation system, according to embodiments described herein.

FIG. 6 illustrates a mobile application of an energy generation system 600, according to embodiments. The EGS 600 may be mounted onto a mobile platform, for example, a truck. The EGS 600 may be suitable for a temporary field application. For example, in a natural gas farm environment where there is an ample supply of natural gas but lack of electricity, the EGS 600 can convert natural gas into electricity for use.

Figure 7:
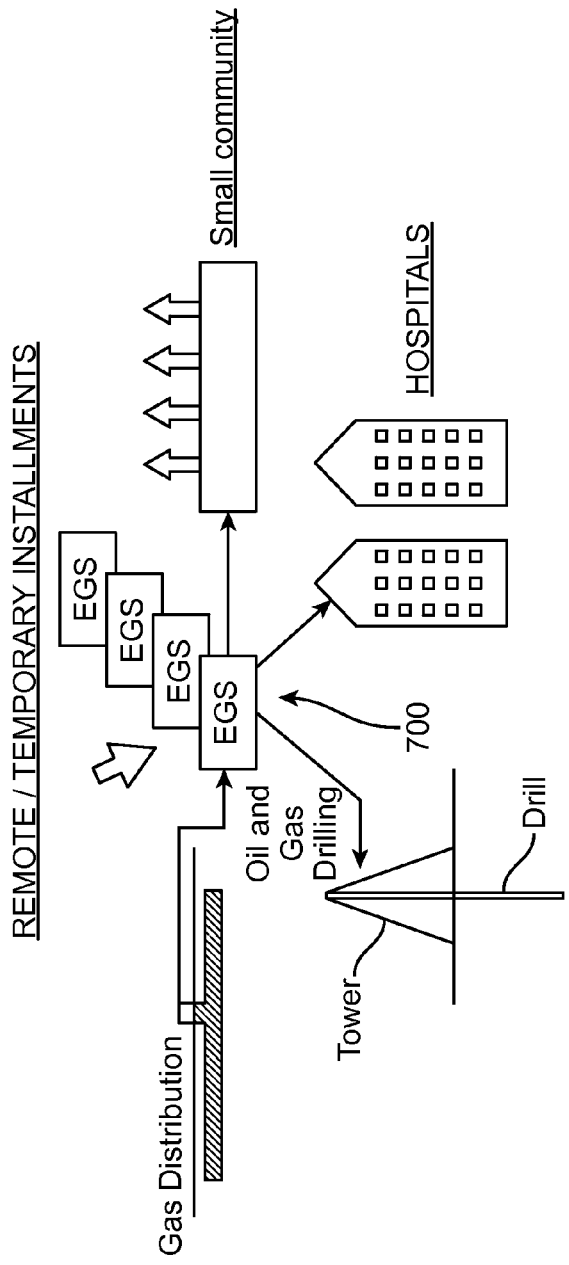
FIG. 7 illustrates a remote application of an energy generation system, according to embodiments described herein.

FIG. 7 illustrates an embodiment of a remote application of an energy generation system 700, according to one or more embodiments. Similar to the application of the EGS 600 of FIG. 6, one or more EGS(s) 700 can be installed at a remote site where ample supply of natural gas can be found, for example, a natural gas farm, sewage plant, farm, or an oil drilling platform. In use, the EGS 700 can convert natural gas found in such locations in electricity which can either be used at the remote site (e.g., natural gas farm, sewage plant, etc.) or transmitted using power lines or other electric power transmission means known in the art for commercial/residential use.

Figure 8:
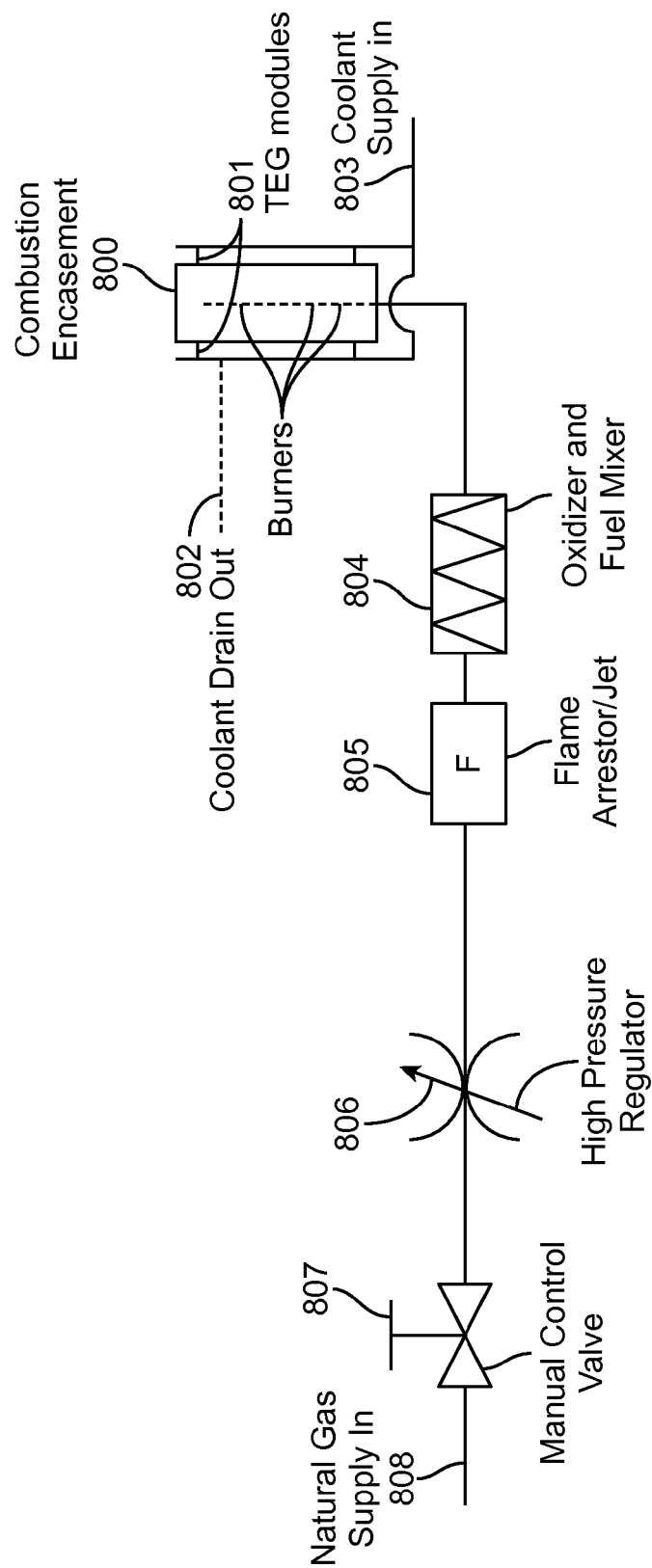
FIG. 8 illustrates an embodiment of a test rig system for testing TEG modules.

FIG. 8 illustrates an embodiment of a test rig system for testing TEG modules. A natural gas supply 808 is regulated through a control valve 807, a high pressure regulator 806, a flame arrestor 805 and an oxidizer 804 to be combusted in a burner 800. The heat flows from the burner 800's chamber to TEG modules 801, which are cooled by water supplied from a water flow inlet 802 to a water flow outlet 803. If the TEG modules 801 can perform (e.g., generate electrical energy) within predetermined specifications, the TEG modules 801 successfully pass the test.

Figure 9:
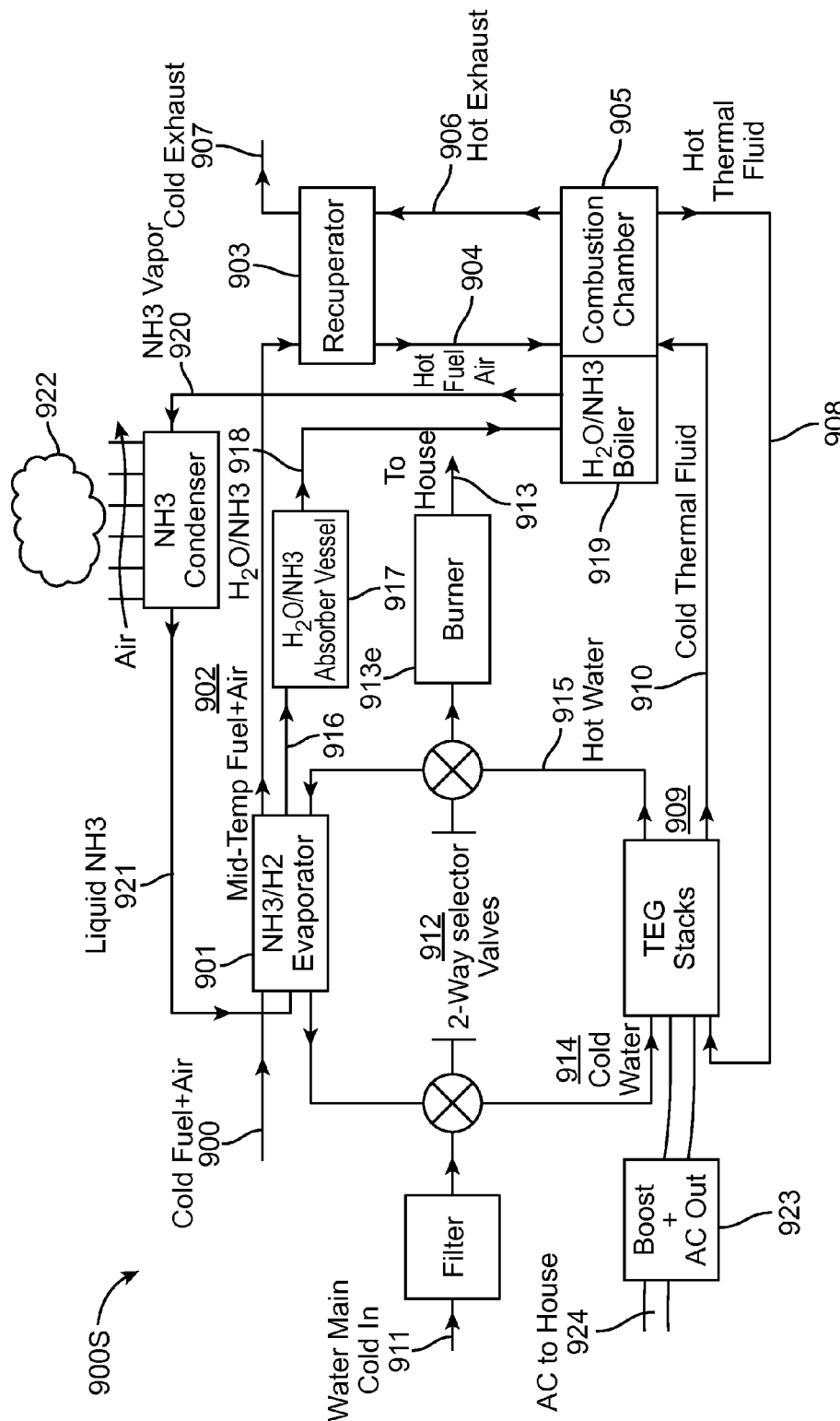
FIG. 9 illustrates an embodiment of an energy generation system with a closed hot thermal loop, a recycled water cooling loop, and a heat-powered refrigeration loop for efficiency maximizing recuperation.

FIG. 9 illustrates an embodiment of an energy generation system 900s with a closed thermal loop (formed by flows 908 and 910), a recycled water cooling loop (formed by flows 911, 913, 914 and 915), a heat-powered refrigeration cooling loop (formed by flows 916, 918, 920 and 921), and a recuperated gas combustion process (formed by flows 900, 901, 902, 903, 904, 906 and 907). Element 900 is a cold fuel and air flow. Element 901 is an evaporator which may correspond to a water and/or ammonia based evaporator and may be used to cause heat flow 900 to form a mid temperature fuel plus air flow 902. Element 903 is a thermal recuperator which is used to convert heat flow 900 into a hot fuel and air flow 904 which is then sent to a combustor/combustion chamber 905. Combustor 905 may correspond to a gas combustor or an oil based combustor configured to burn petroleum based oil, alternative plant-based fuel oils (e.g., recovered cooking oil, corn oil, soybean oil, etc.) as well as methanol, ethanol or other combustible alcohol known in the art. Recuperator 903 is heated by the hot exhaust flow 906 from chamber 905. Recuperator 903 is also used to cool hot exhaust 906 to a cold exhaust 907 allowing the system to be placed nearby a residence without excessive heating of a residence exterior and/or placed within a room of the residence without excessive heating of the room (in particular embodiments, the recuperator can be configured to emit exhaust gases at temperature below 90, 85, 80, 75 or even 70° F. with lower temperatures contemplated). In these and related and related embodiments recuperator 903 may correspond to a counter flow heat exchanger (e.g., horizontal flat panel, vertical flat panel or modular panel) whereby heat from hot exhaust 906 is exchanged with mid temperature fuel air flow 903. Combustion chamber 905 may be used to heat a thermal fluid received which is then sent as heated thermal fuel flow 908 to heat TEGs in the energy generation module 909. Once the heat from hot thermal fluid flow 908 is passed to the TEGs in modules 909, the thermal fluid exists as a cold thermal flow 910 which is then sent back to be heated by combustion chamber 905. The thermal fluid in thermal fluid flow 909 may correspond to one or more of oil (petroleum or synthetically based), brine solution, molten salt or molten metal.

Chamber 905 may also be used to a heat boiler 919 which may correspond to a water or ammonia based boiler 919. In the latter embodiments an ammonia vapor stream 920 is sent to a refrigeration condenser 922 (which may be located outside) and used to produce a liquid ammonia stream 921 which is then sent back to evaporator 901. For either water or ammonia embodiments, boiler 919 may be supplied with water or ammonia stream 918 from an absorber vessel 917 which captures and stores liquid water or ammonia received as a liquid flow 916 (water or ammonia) from evaporator 901.

Energy generation module (EGM) 909 comprising TEG stacks may generate electrical energy from the temperature difference between flows 908 and 914. The created DC electrical potential is boosted and alternately inverted by a converter 923 to 120 or 220V AC, and is then outputted to an outlet 924 for use with household appliances. Excessive heat from the energy generation system 900s can be rejected to the atmosphere from refrigeration condenser 922 and/or from combustion exhaust 907. In specific embodiments, the excessive heat may be used to produce a hot water outlet 913 to the consumer's house. In these and related embodiments, a cold water inlet 911 stream is sent to a two way selector valve 912 which is used to send a cold water stream 914 to TEG stacks in EGM 909 where it is heated by the waste heat from the stacks to produce a hot water outflow 915 sent back to the two way selector valve 912, where it may be directed to hot water outlet 913, or as a hot water stream 916 sent to evaporator 901. In some embodiments, the cold water inlet stream 914 may first pass through a filter 911f. Also, in some embodiments, hot water outlet 913 may include an internal burner or other heating element 913e to boost the water temperature.

Figure 10:
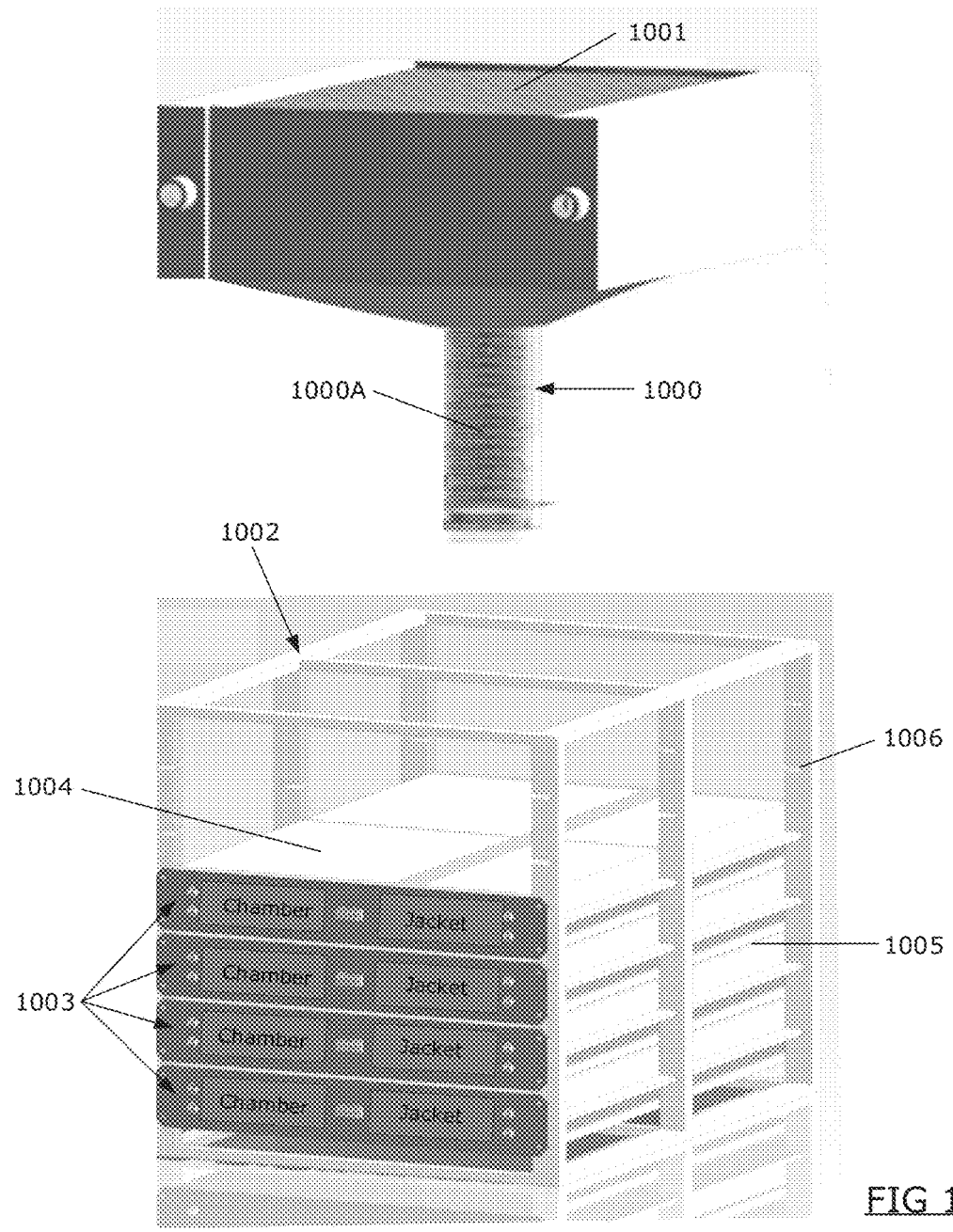
FIG. 10 illustrates an isometric view of an embodiment of an energy generation system with a central burning chamber and one or more stackable energy generation modules for energy recuperation.

FIG. 10 illustrates an isometric view of an embodiment of an energy generation system with a central burning chamber 1000 with a thermal loop 1000A seated inside for use with one or more EGMs 1003. As shown in the figure, the burning chamber 1000 is also vertically oriented with respect a vertical axis (not shown) of EGMs 1003. While the burning chamber is shown centered or otherwise substantially centrally aligned with the center of EGMs 1003 other non-centered positions of the burning chambers are also considered. A thermal recuperator 1001 rests above the central burning chamber 1000 to pre-heat the incoming combustible fuel. The EGMs 1003 can be made into sub-modularized stackable modules configured to be mounted into an EGM rack or chassis 1002. Stackability of the EGMS 1003 can be achieved through a variety of means, for example, through the selection of the size and shape of the EGM 1003 as well as through the use of one or more fittings 1005 in the body 1004 of the EGM which fit into slots 1006 in chassis 1002 as shown in FIG. 10. In these and related embodiments, the EGMs 1003 can be structured to not only be stackable and modularized to allow for the easy addition or removal of an individual EGM 1003 from rack 1002, but also constructed to reduce thermal or electrical cross talk between adjacent EGMS. This can be accomplished by the selection of the spacing between adjacent EGMS 1003 (the spacing can be selected to minimize heat transfer between EGGMs by conduction, radiation, etc., and can be in a range e.g., from 0.5 to 4 inches) as well as through the use of aerogel or other thermal and/insulation material and/or insulating structure that is placed within or around each EGM. The selected insulation material may also be lubricous to facilitate easy insertion or removal of EGM 1003 from the rack 1002. Such embodiments allow for the ready customization of an energy supply system to meet the needs of a particular residence as well as for the rapid addition or removal of a particular EGM for service and/or for changing power requirements.

Figure 11:
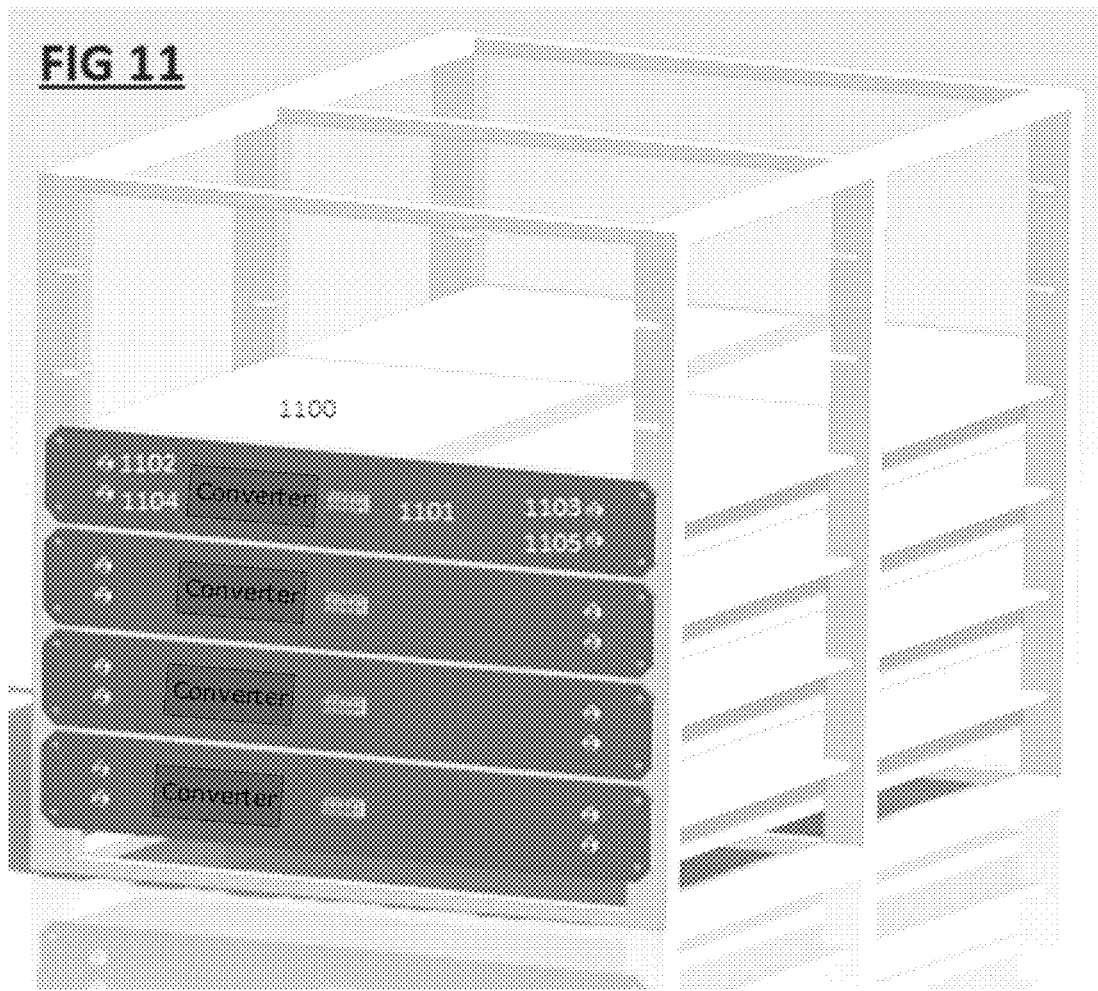
FIG. 11 illustrates an embodiment of the stackable energy generation modules of FIG. 10.

FIG. 11 illustrates a plurality of stackable EGMs 1100 that are embodiments of the stackable EGMs of FIG. 10. A stackable EGM 1100 may include a cold water inlet 1102 and a hot water outlet 1103 for water circulation, and includes a thermal fluid inlet 1105 and thermal fluid outlet 1104 for a cross-flow (e.g., counter current flow) of thermal fluids. The EGM 1100 generates DC electrical power and can be connected to state measuring devices, such as thermocouples, thermistors and/or flow meters, through a connector 1101. It may also be coupled to a DC to AC converter similar to other such converters described herein (not shown in this embodiment) for conversion of DC power to AC power, for example 120 or 220 volts AC.

Figure 12:
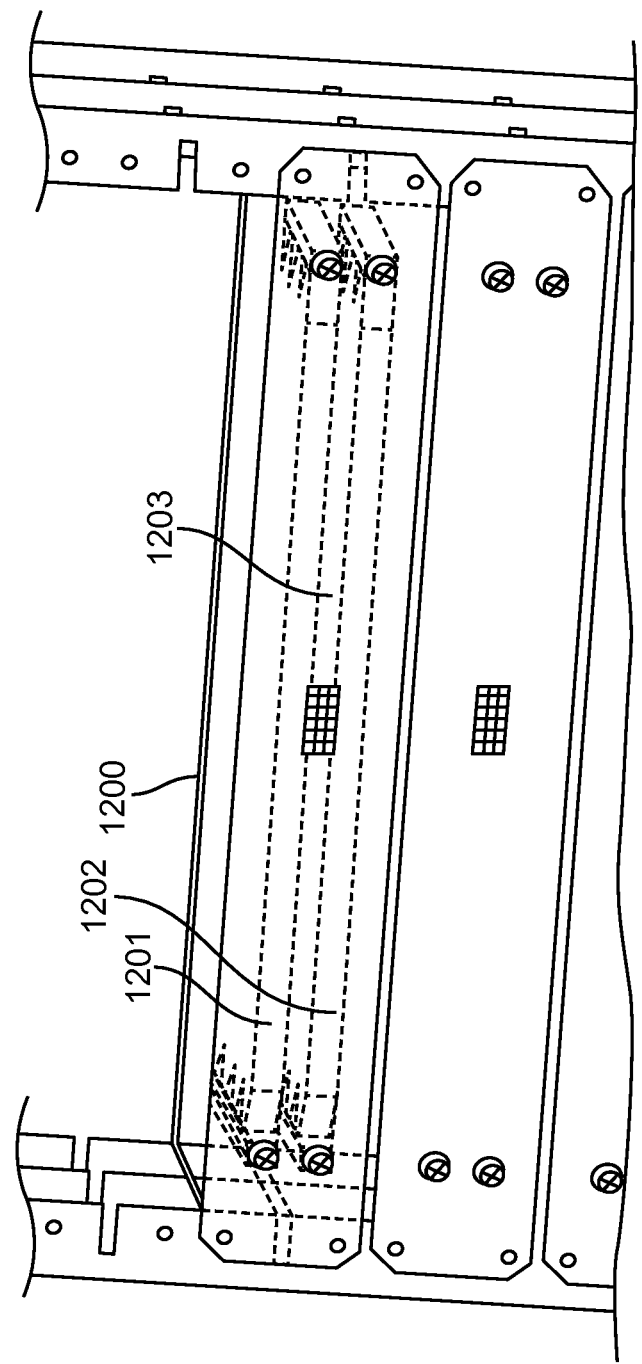
FIG. 12 illustrates an embodiment of a single stackable modularized energy generation module.

FIG. 12 illustrates a single stackable modularized EGM 1200 that is an embodiment of the stackable EGM 1100 of FIG. 11. A thermal fluid panel 1202 transfers heat from itself through a plurality of TEGs 1203 to a cooling fluid panel 1201. The thermal fluid (e.g., from the thermal fluid inlet 1105 of FIG. 11) is recycled and re-cooled.

Figure 13:
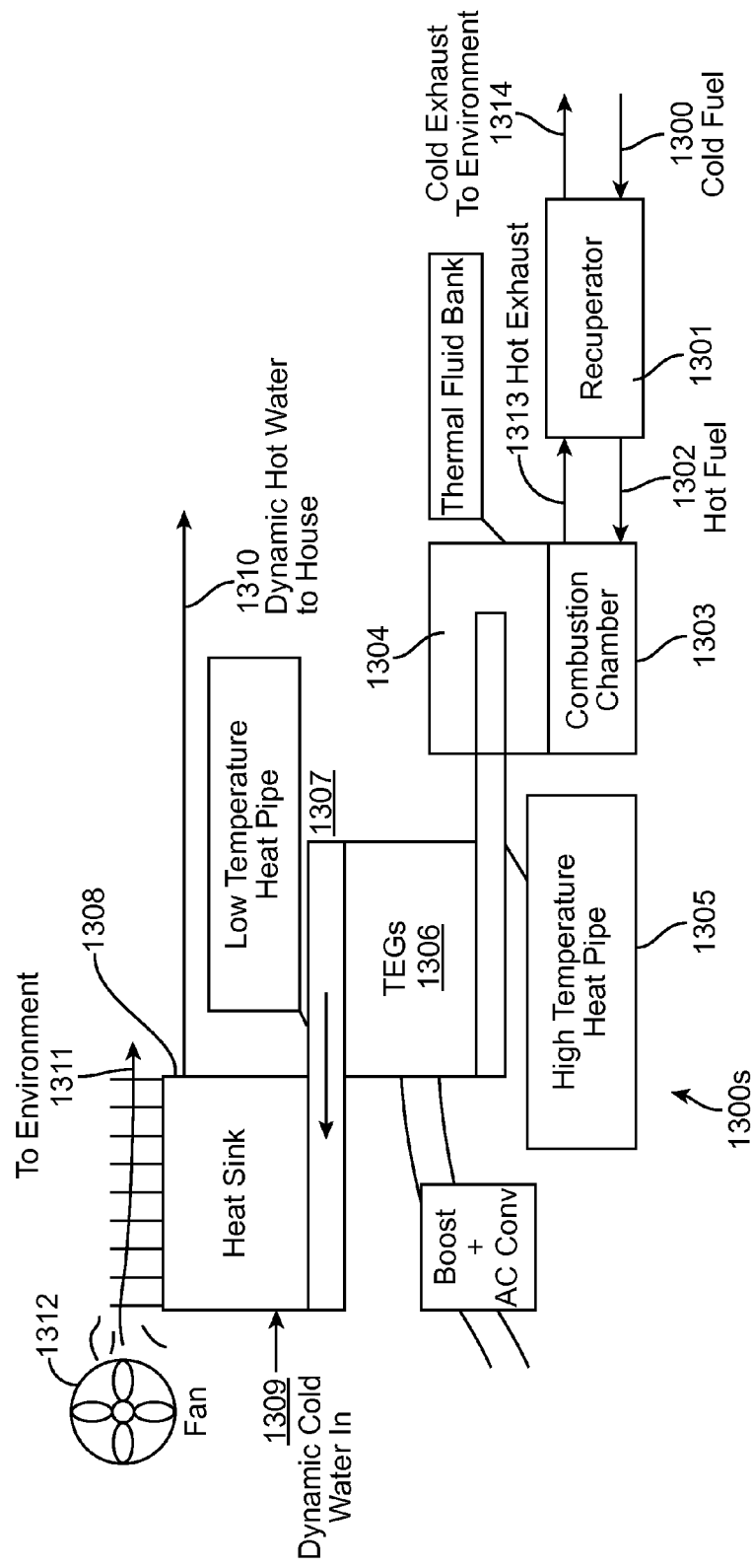
FIG. 13 illustrates an embodiment of an energy generation system utilizing a thermal reservoir and heat pipe technology for increased thermal flow efficiency.

FIG. 13 illustrates an embodiment of an energy generation system 1300s. As illustrated in FIG. 13, cold fuel 1300 is pre-heated through a recuperator 1301 and becomes hot fuel 1302, and the hot fuel 1302 is combusted in the combustion chamber 1303. The heat generated from the combustion is transferred onto a thermal fluid reservoir 1304. Exhaust gases 1313 generated from the combustion is passed back through the recuperator 1301 to transfer heat to the incoming fuel, and is finally rejected into the atmosphere through a cold exhaust 1314. Thermal energy is transferred from the thermal fluid reservoir 1304 through one or more high temperature heat pipes 1305 to a plurality of TEGs 1306. The cold sides of the TEGs 1306 are cooled by a low constant heat flux or a constant temperature heat pipe 1307. The temperature heat pipe 1307 is then cooled by a water-cooled heat sink 1308. Cold water 1309 passes through the heat sink 1308 and absorbs the heat from the heat sink 1308. The resulting heated water can be used as a dynamic hot water source 1310 for the consumer's use. Excessive heat can also be taken away from the heat sink 1308 using natural air flow (e.g., via convection) to the atmosphere 1311. As an alternative or in addition to natural flow, the heat sink can be cooled from air flow driven by a fan 1312 which may be placed in proximity to heat sink 1308. Control of the fan can be driven using one or more control modules described herein which are coupled to thermal couples or other temperature sensors placed on or in proximity to the heat sink.

Figure 14:
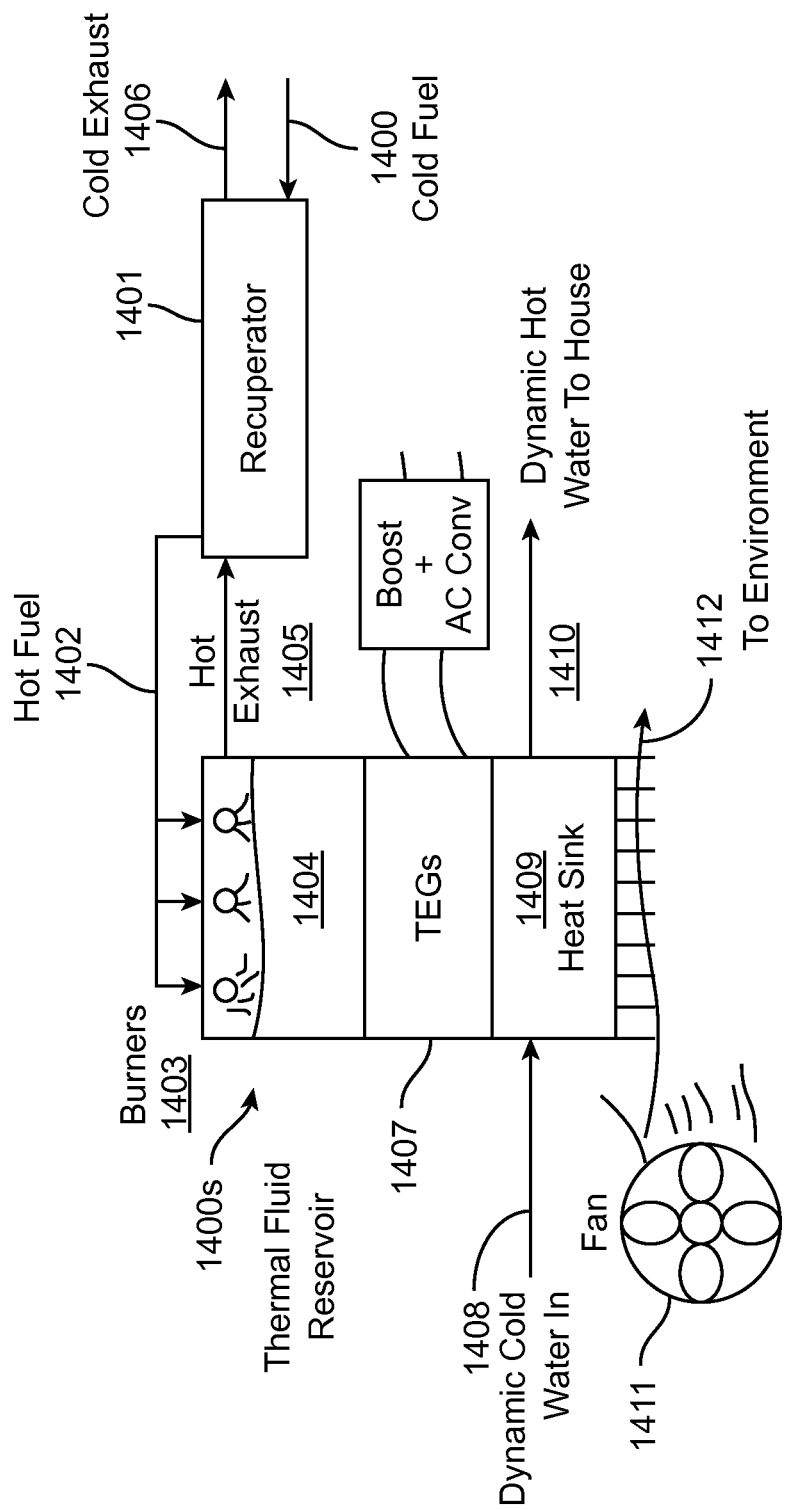
FIG. 14 illustrates an embodiment of a gravity forced energy generation system utilizing a thermal fluid reservoir.

FIG. 14 illustrates an embodiment of a gravity forced energy generation module system 1400s. As illustrated in FIG. 14, cold fuel 1400 is pre-heated through a recuperator 1401 and becomes hot fuel 1402. The hot fuel 1402 is combusted in a burner 1403. Preheating of the fuel serves to improve combustion and efficiency as well as fuel flow for more viscous fuel oils. The heat generated from the combustion is then transferred onto/into a thermal fluid reservoir 1404, which in turn transfers heat to a plurality of TEGs 1407. The thermal fluid can comprise one or more high heat capacity fluids such as oil, silicone oil, polyalkylene glycol based solutions, brine solution, molten salt or molten metal and the like. The TEGs 1407 generate electricity and are cooled in a similar fashion as that shown in FIG. 13. Also, hot exhaust from burner 1403 is sent to recuperator 1401 where it is cooled (e.g., by a heat exchange with cold fuel 1300) and then vented to the atmosphere in the form of cold exhaust 1406. In use, this and related configuration for energy generation system 1400s improves efficiency of the system (e.g., efficiency of energy conversion) and reduces the thermal load to the ambient environ allowing the system to placed indoors or close to a residence without the need for excessive cooling.

Figure 15A:
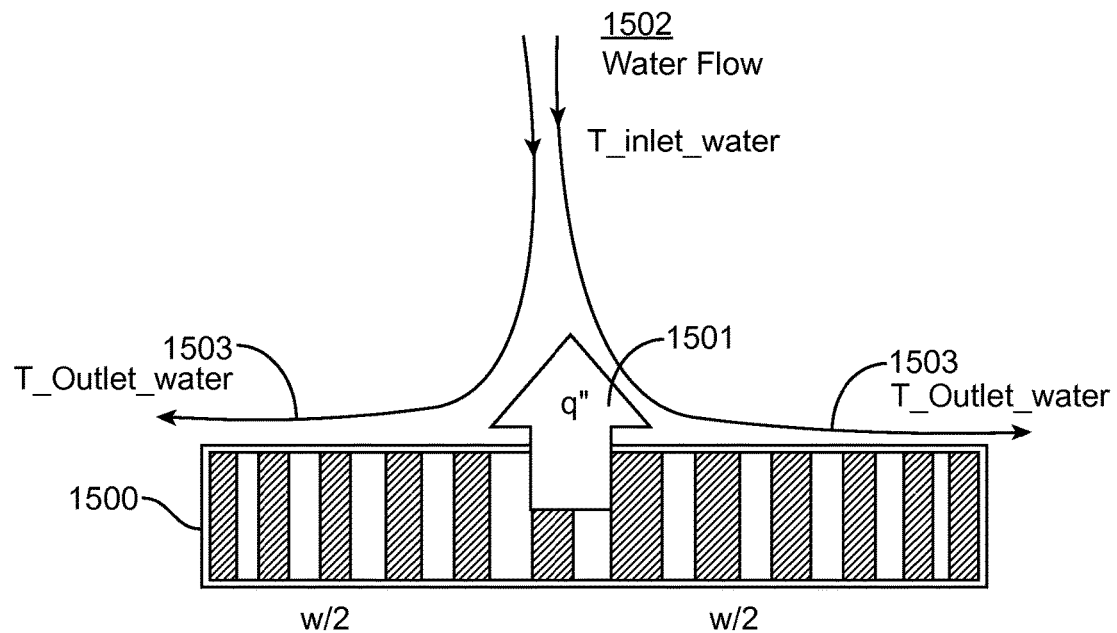
FIG. 15A illustrates a side view of an embodiment of jet impingement cooling on the energy generation modules.
Figure 15B:
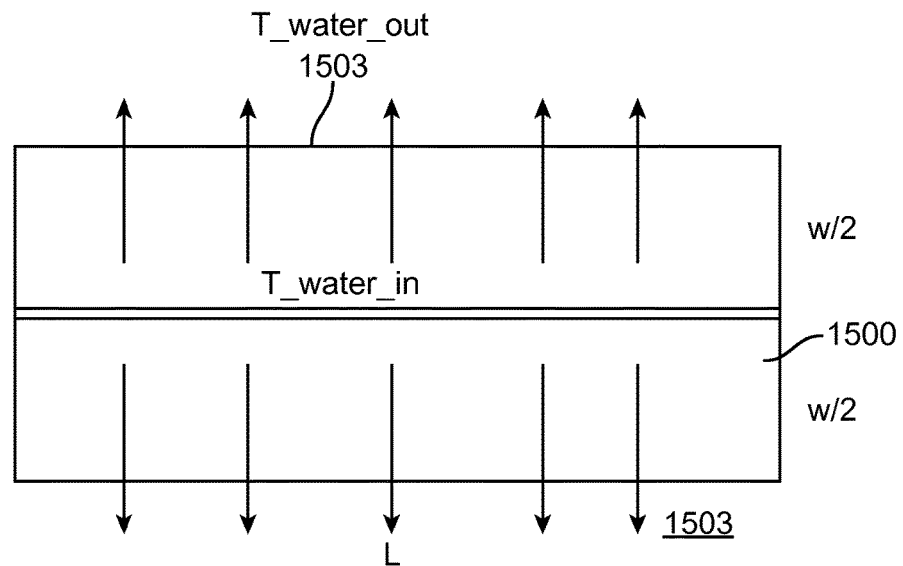
FIG. 15B illustrates an overview of the embodiment of jet impingement cooling on the energy generation modules, as illustrated in FIG. 15A.

FIG. 15A illustrates a side view of an embodiment of jet impingement cooling of the energy generation modules 1500. FIG. 15B illustrates an overview of the embodiment of jet impingement cooling of the energy generation modules 1500, as illustrated in FIG. 15A. Cold water is impinged from a cold water inlet 1502 onto a plurality of TEGs 1500 through gravity fed and/or pump induced flow. The cold water (the flow of which is labeled as 1503 in FIG. 15A) takes away heat 1501 from the TEGs 1500. In this configuration, the cooling water 1503 can experience a reduced temperature rise so that it requires less water flow and thus pump work than a system without jet impingement cooling thereby improving the efficiency of the system.

Figure 16:
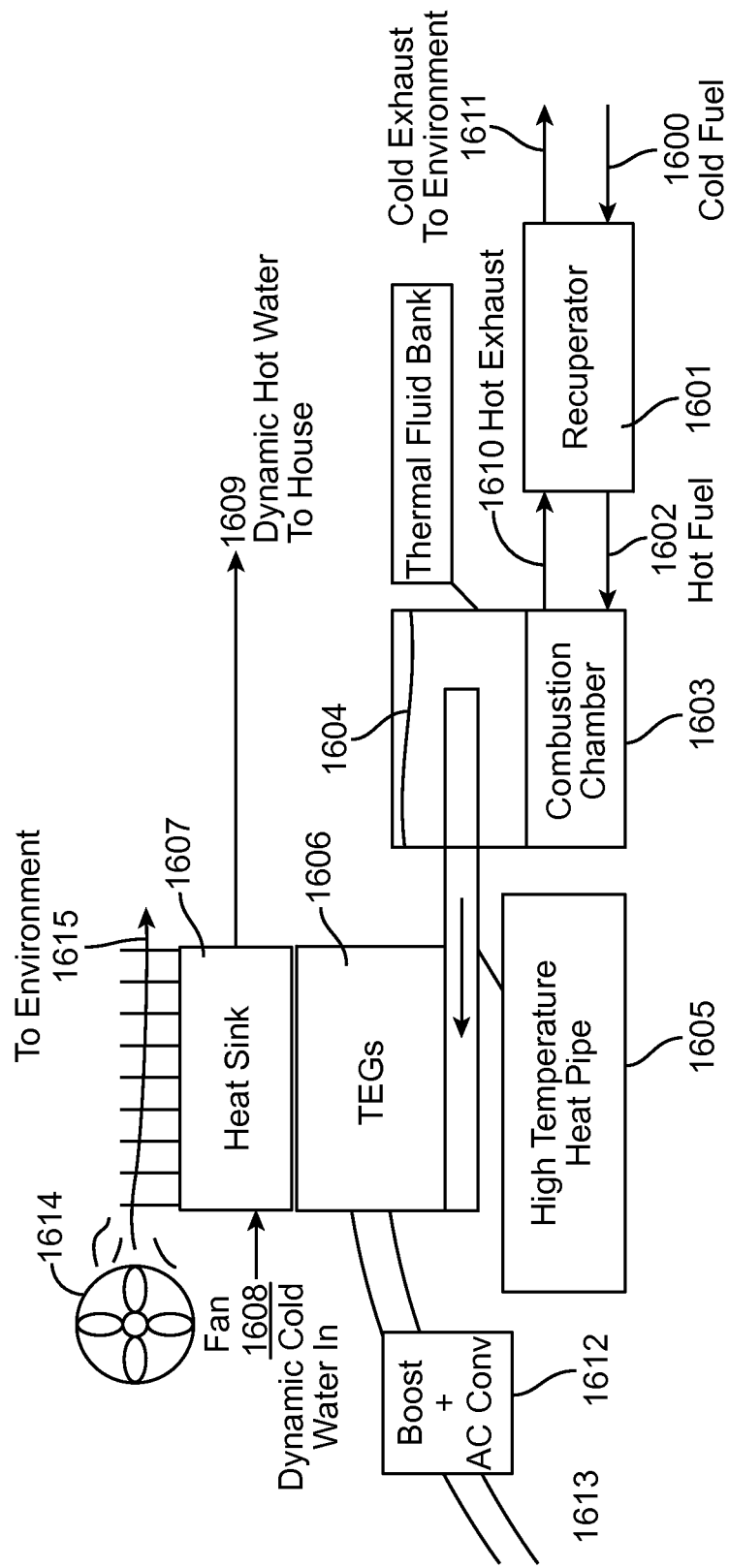
FIG. 16 illustrates a simplified embodiment of the energy generation system as shown in FIG. 13.

FIG. 16 illustrates a simplified embodiment of the energy generation system as in FIG. 13. As illustrated in FIG. 16, cold fuel 1600 is pre-heated through a recuperator 1601 and becomes hot fuel 1602. The hot fuel 1602 is combusted in a combustion chamber 1603, and the heat generated from the combustion is transferred onto thermal fluids contained in a thermal fluid reservoir 1604. The heat is then transferred with a high temperature heat pipe 1605 to one or more EGMs 1606. The heat pipe 1605 can transfer heat with high efficiency. The EGMs 1606 are cooled by a heat sink 1607, which can be cooled with either a cooling fluid 1608 or with ambient heat rejection (e.g., air-cooled), or a combination of the two. The heat sink my comprise a thermally conductive structure (e.g., metal) having a selected thermal mass, and/or a heat transfer liquid, (e.g., water, salt solution, freon or like liquid) or a combination of both. Ambient heat rejection can be enhanced by improving air circulation around the heat sink 1607 through use of a fan 1614. If the cold cooling fluid 1608 used for cooling is water, then the water may be heated during the heat sink cooling process, and the heated water can be used as a source of hot water 1609 for consumer use. The remaining, excessive heat is rejected to the ambient environment (e.g., the atmosphere 1615). Also, hot exhaust from burner 1610 is sent to recuperator 1601 where it is cooled (e.g., by a heat exchange with cold fuel 1600) and then vented to the environment/atmosphere 1615 in the form of cold exhaust 1611. The EGMs 1606 produce DC electrical power which is boosted and alternately inverted by a converter 1612 to either 120 V AC electrical power for normal household use or 220 V AC electrical power for use by one or more appliances.

Figure 17:
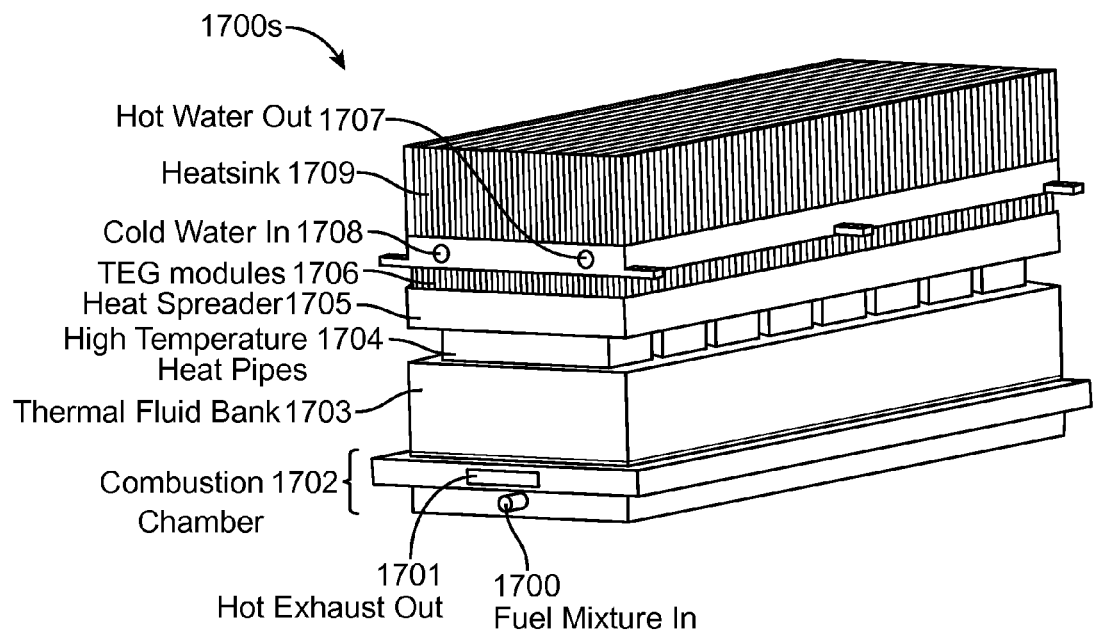
FIG. 17 illustrates an isometric view of an embodiment of an energy generation module utilizing a thermal reservoir and heat pipes.

FIG. 17 illustrates an isometric view of an embodiment of an energy generation module system 1700s utilizing a thermal reservoir 1703 and heat pipes 1704. A pre-heated fuel inlet 1700 injects pre-heated fuel into a combustion chamber 1702, which combusts the fuel and heats up a thermal fluid reservoir 1703. Exhaust gases resulted from the combustion vent through a recuperator (not shown in FIG. 17) to a hot exhaust outlet 1701. One or more high temperature heat pipes 1704 are submerged in the thermal fluid reservoir 1703, thus creating an even heating distribution from the reservoir 1703 to the heat pipes 1704. The heat pipes 1704 transfer heat efficiently from one end to another end of the pipe at a selected temperature or heat flux. Depending on the embodiment, this temperature or heat flux can be either actively controlled (e.g., by sensors and switches) or statically controlled (e.g., by choices of materials when designing). The heat pipes 1704 reject the heat to a heat spreader 1705 that disperses the heat evenly over TEG modules 1706 so to improve the efficiency of energy conversion by the TEG modules. Heat spreader 1705 can be fabricated from various conductive metals (e.g., copper, etc. and can have a shape and size to match that of one or more TEG modules 1706. Atop the TEGs 1706 is a heat sink 1709, which is cooled by forced convection of ambient air. The heat sink 1709 may also include water cooling lines 1707 and 1708 to dynamically heat water. The EGMs 1706 can be sized for a specific amount power generation (e.g., for all or a portion of the needs of a single home or multiple homes). According to some embodiments, multiple EGMs (e.g., modules 1706) can be grouped to provide incremental power increases for larger consumer demands.

Figure 18:
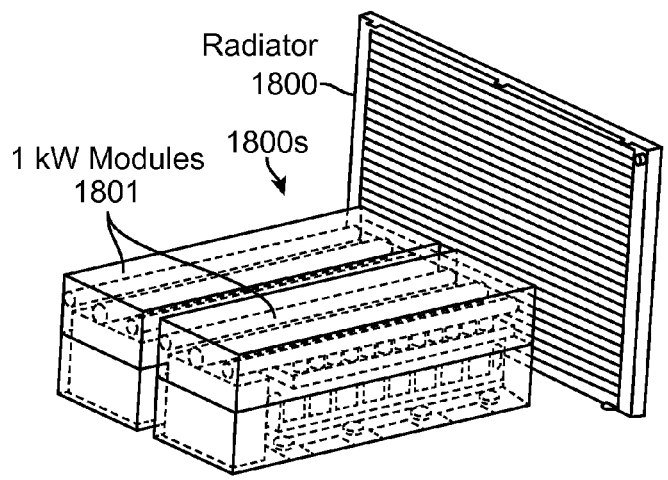
FIG. 18 illustrates a perspective view of an embodiment of an energy generation system with water cooling and a radiator for heat rejection into the atmosphere.

FIG. 18 illustrates a perspective view of an embodiment of an energy generation module system 1800s with water cooling and a radiator 1800 for heat rejection into the atmosphere. With the excess of rejected heat, a portion of that heat can be converted directly into mechanical energy through the use of a Sterling engine or other heat powered devices (not shown) for use of fans, pumps and valves that reside in the system to increase total system efficiency.

With simultaneous reference to both FIGS. 17 and 18, according to one embodiment, the system combusts residential natural gas and heats up the high temperature heat pipes up to about 1000° C. The heat pipes then transport the heat over an area covered by therm-electric generators. The therm-electric generators are designed to create an electric potential when a temperature gradient exists between the cold and hot interface. The cold interface is kept cool to about 90° C. through means of active water cooling (e.g., through jet impingement as described above). The heated water can be used for household use, be utilized to pre-heat any incoming fuel, and/or be used to power heat-driven mechanical pumps and fans. The remaining excessive heat is rejected to the environment. According to particular embodiments, the system is designed to minimize energy losses and maximize total combined heat and power (CHP) efficiency through the appropriate use of thermal insulation (e.g., poured aerogel) and energy re-uses (e.g., hot water or heated air) made available to the consumer. According to some embodiments, the system is modularized into 1 KW energy generation modules. These modules can simply be grouped together to create higher power output systems with appropriate sizing of the coolant, recuperation and circulation systems. According to certain embodiments, aerogel is positioned to create a thermal insulation barrier between all the components where heat loss is undesirable to avoid unnecessary energy losses.

Figure 19A:
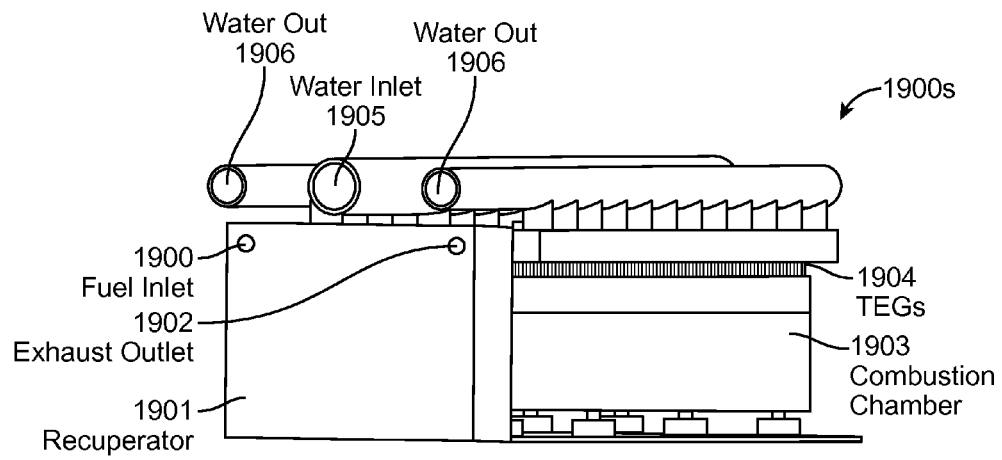
FIG. 19A illustrates an isometric view of another embodiment of an energy generation module.
Figure 19B:
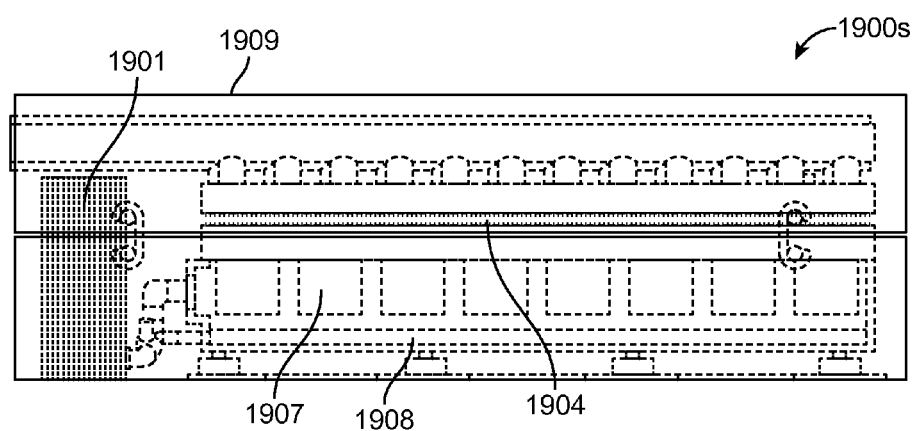
FIG. 19B illustrates a perspective view of the embodiment of the energy generation module of FIG. 19A.

FIG. 19A illustrates an isometric view of another embodiment of an energy generation module system 1900s. FIG. 19B illustrates a perspective view of the embodiment of the energy generation system module shown in FIG. 19A. In this module, a recuperator 1901 is included in a EGM module having a form factor 1909, where pre-mixed cold fuel 1900 enters the recuperator 1901. The cold fuel 1900 then is heated up and combusted from a burner 1908 inside the combustion chamber 1903. The heat generated from the combustion of fuel 1900 is transferred directly onto one or more high temperature heat pipes 1907. According to embodiments, the thermal characteristics of the heat pipes 1907 can be selected to efficiently transfer and disperse heat evenly over a spread of TEGs 1904. The TEGs 1904 are cooled with jet impinged cooling water inlet 1905 and outlets 1906. The cooling water flow rate is controlled heat rejection radiators, pumps and fans within the system in the manners described above.

Figure 20A:
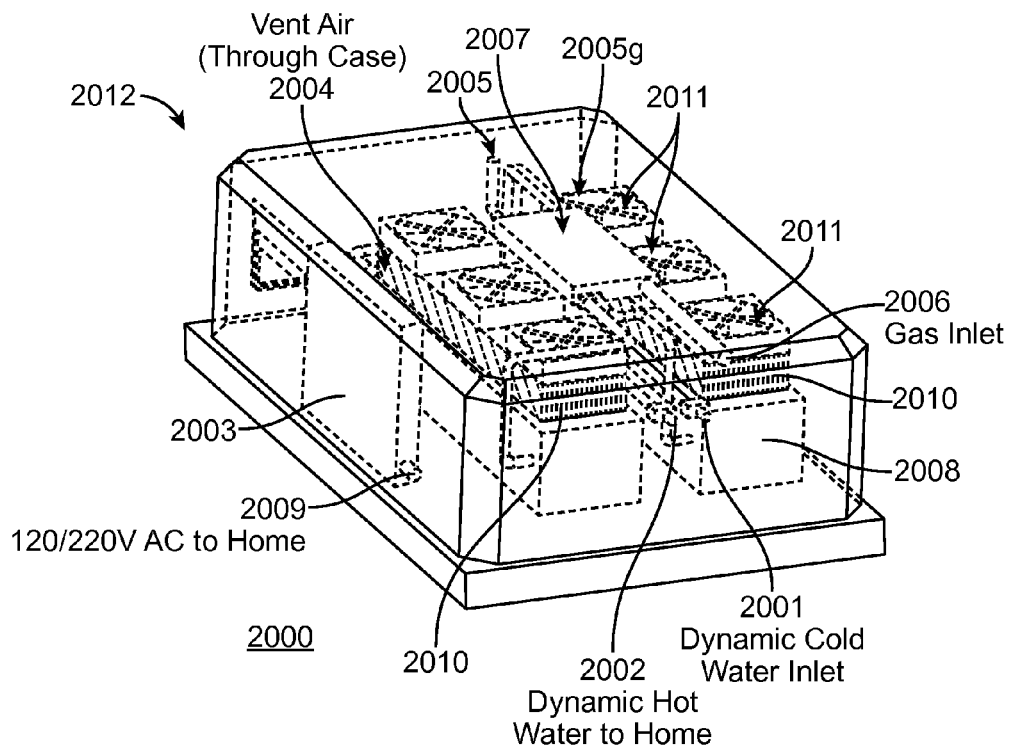
FIG. 20A illustrates a perspective view of yet another embodiment of an energy generation system.
Figure 20B:
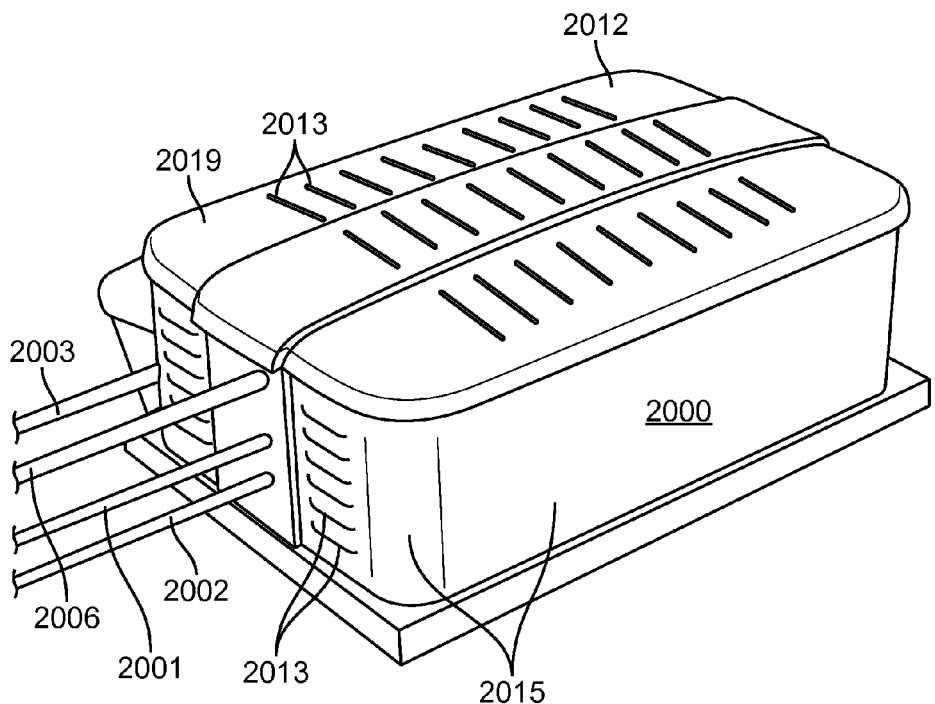
FIG. 20B illustrates an isometric view of a casing for the energy generation system of FIG. 20A.
Figure 20C:
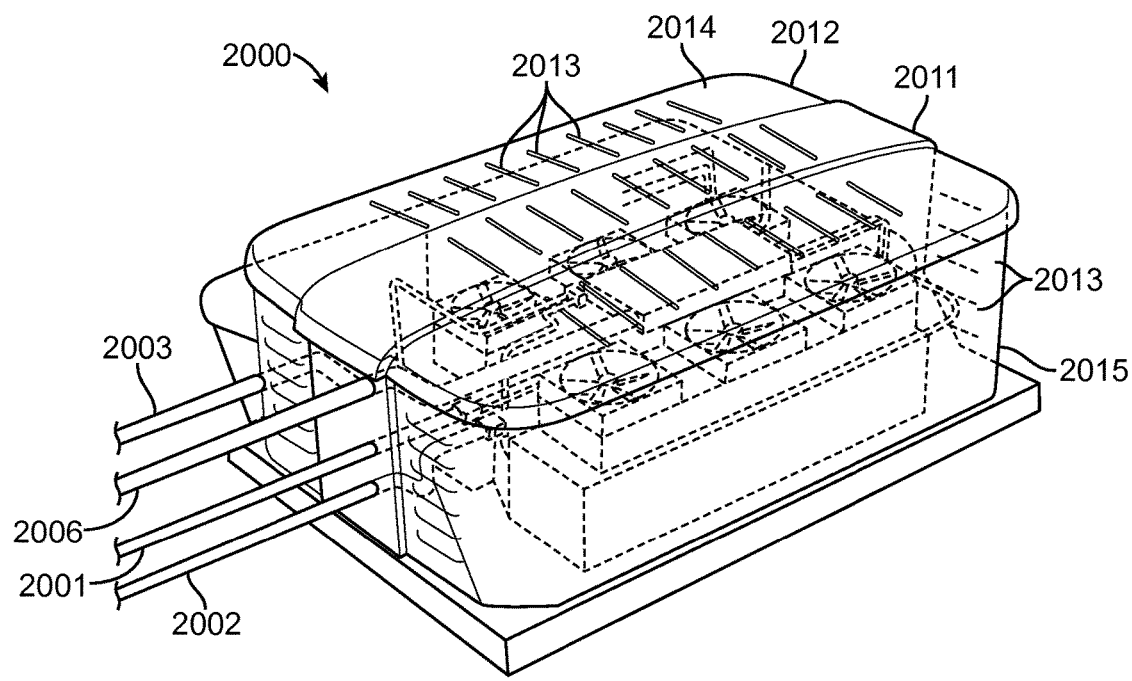
FIG. 20C illustrates a perspective view of the casing of FIG. 20B in conjunction with the energy generation system of FIG. 20A.

FIG. 20A illustrates a perspective view of yet another embodiment of an energy generation module system 2000. FIG. 20B illustrates an isometric view of a casing 2012 for the energy generation system of FIG. 20A. Casing 2012 is desirably configured to protect one more or embodiments of the energy generation systems described herein from the elements allowing them to be placed in the outside environment. FIG. 20C illustrates a perspective view of the casing 2012 of FIG. 20B in conjunction with the energy generation system of FIG. 20A. The system 2000 takes in natural gas from a natural gas inlet 2006, premixes the natural gas with air, and recuperates energy in manners described above (the recuperator is not shown in this embodiment though). Specifically, the system combusts the pre-heated mixture in a combustor 2007 and transfers the heat to the energy generation modules (EGM) 2008 in order to produce heat and electrical power. The exhaust gases 2005g generated from the combustion are vented through an exhaust outlet 2005. Typically the electrical output from EMGs 2008 is DC and may be converted to 220 VAC electrical power via a converter 2003 where it is available to the consumer for home or other use at an electrical outlet 2009. Cold water, which comes from cold water inlet 2001, is also heated during the process of cooling down the EGMs 2008, and the resulting hot water is available for the consumer at hot water outlet 2002. Other excessive heat may be rejected to the atmosphere from air circulation (e.g., via vent air 2004). In particular embodiments, the EGMS 2008 may also be cooled by one or more heat sinks 2010 directly or otherwise thermally coupled to EMG 2008. Heat sinks 2010 may correspond to other heat sinks described herein. Heat sinks 2010 may be cooled by one or more fans 2011 and/or by vent air 2004 flowing through casing 2012 by means of one or more vents 2013 which may be located in top 2014 or side portion 2015 of casing 2012. In some embodiments top portion 2014 can be removable to provide access to one more components of system 2000 described above.

Figure 21A:
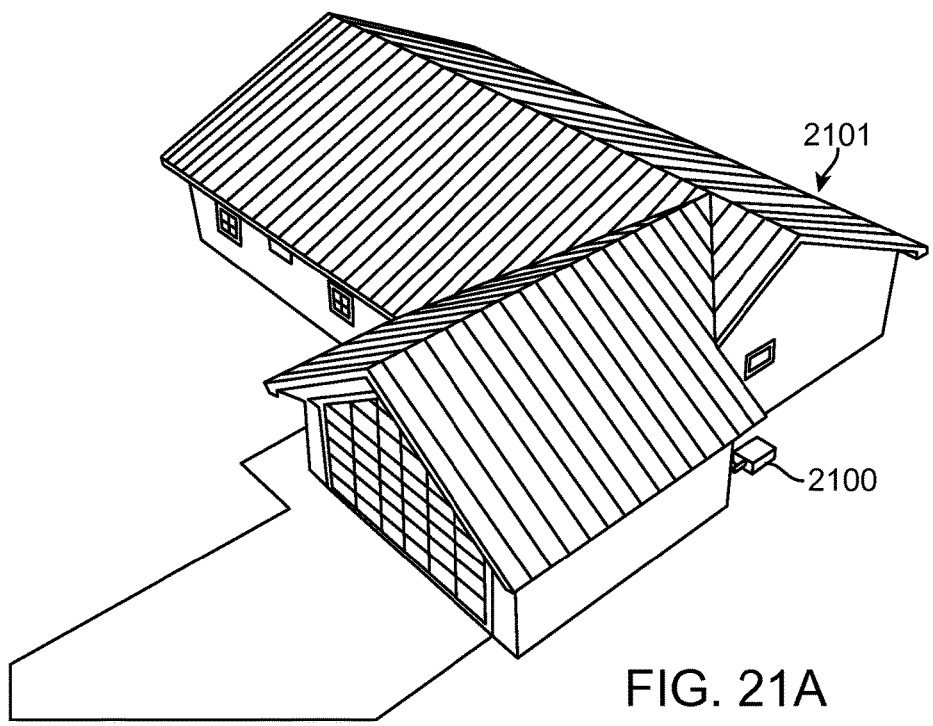
FIG. 21A is an isometric view illustrating a residential installment of an embodiment of an energy generation system.
Figure 21B:
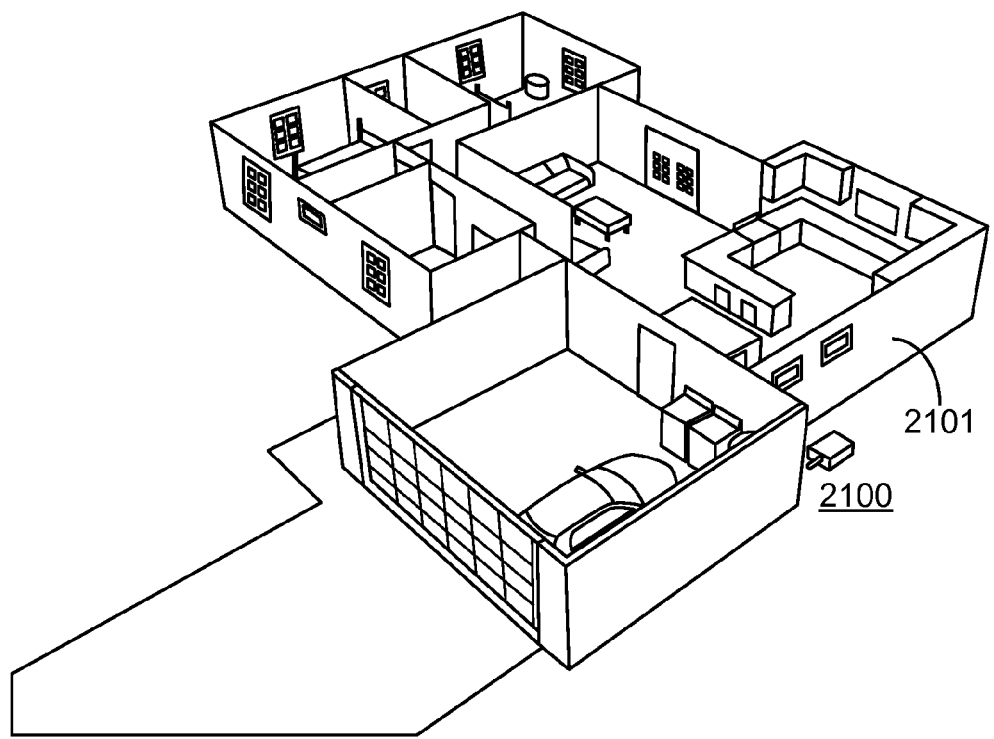
FIG. 21B is a cutaway isometric view of the embodiment of FIG. 21A.

Referring now to FIG. 21A and FIG. 21B, according to one or more embodiments, an energy generation system 2100 can be configured to be installed outside a residential home or other residence 2101. The energy generation system 2100 may be placed adjacent, otherwise near the residence as is shown in the embodiments illustrated in FIGS. 21A and 21B. In particular embodiments it may be placed in close proximity to a washer dryer to supply hot water to the washer as well as use waste heat for the dryer. Alternatively, it may be placed some distance away, for example 50 or 100 yards, to minimize the likelihood of any fumes from a combustor or heat from the TEGs adversely affecting the safety of the residence. It may also be buried in the ground and/or placed in a concrete or other protective structure.

Various embodiments of the energy generation systems described herein can be used provide efficient electrical, heating and potentially cooling utilities to a household residence or other building. Particular embodiments of the energy generation system can be designed around very specific heat flows, while minimizing losses and maximizing total system efficiency. Embodiments of the invention also provide control systems which can be configured to monitor household electricity usage and dynamically regulate embodiments of the energy generation system to operate at maximum efficiency.

CONCLUSION

The foregoing description of various embodiments of the invention has been presented for purposes of illustration and description. It is not intended to limit the invention to the precise forms disclosed. Many modifications, variations and refinements will be apparent to practitioners skilled in the art. For example, various embodiments of the energy generation systems can be sized and otherwise adapted for placement in variety of locations within or outside of a residence or other building. They may also be configured to be used as backup generators in hospitals, schools, and power plants (e.g., nuclear power plants) to supply power for mission critical operations, for example for the running of pumps for water purification, medical use or nuclear generators. They may be also be configured to be used with a variety of heat sources in addition to combustion sources such as solar, geothermal or other hot water heat source.

Elements, characteristics, or acts from one embodiment can be readily recombined or substituted with one or more elements, characteristics or acts from other embodiments to form numerous additional embodiments within the scope of the invention. Moreover, elements that are shown or described as being combined with other elements, can, in various embodiments, exist as standalone elements. Hence, the scope of the present invention is not limited to the specifics of the described embodiments, but is instead limited solely by the appended claims.

What is claimed is:

1. An energy generation system, comprising:
a plurality of energy generation modules configured to be mounted within a framework and structured to be stackable within the framework;
a thermal recuperator to pre-heat incoming combustible fuel for use with the plurality of energy generation modules; and
a central burning chamber for use with the plurality of energy generation modules, the central burning chamber being vertically oriented above with respect to a vertical axis of the plurality of energy generation modules.

2. The energy generation system of claim 1, wherein each energy generation module of the plurality of energy generation modules is configured to generate as much as 1 KW of electrical power.

3. The energy generation system of claim 1, wherein the plurality of energy generation modules are mounted in a rack.

4. The energy generation system of claim 1, wherein each energy generation module of the plurality of energy generation modules further comprises a DC-to-AC converter electrically coupled to a thermoelectric generator to convert a direct current output from the thermoelectric generator to an alternating current.

5. The energy generation system of claim 4, where the DC-to-AC converter is further configured to step up a voltage of an output signal from the thermoelectric generator to 120 or 220 VAC.

6. The energy generation system of claim 5, wherein the central burning chamber further comprises a combustion chamber.

7. The energy generation system of claim 6, wherein the combustion chamber is configured to combust natural gas.

8. The energy generation system of claim 6, wherein the thermoelectric generator is placed in proximity to the combustion chamber.

9. The energy generation system of claim 6, wherein the thermoelectric generator comprises a jacket of thermoelectric generators at least partially surrounding the combustion chamber.

10. The energy generation system of claim 6, further comprising a fuel inlet to the combustion chamber.

11. The energy generation system of claim 10, wherein the thermal recuperator thermally couples to the fuel inlet and to an exhaust outlet of the combustion chamber for each energy generation module of the plurality of energy generation modules, the thermal recuperator configured to recuperate heat from the exhaust outlet of the combustion chamber to cool an exhaust and heat fuel flowing through the fuel inlet to improve combustion efficiency for each energy generation module of the plurality of energy generation modules.

12. The energy generation system of claim 11, wherein the fuel comprises oil, a petroleum based oil or a plant based oil.

13. The energy generation system of claim 6, further comprising:
for each energy generation module of the plurality of energy generation modules, a thermal fluid reservoir thermally coupled to the combustion chamber for transferring heat from the combustion chamber to the thermoelectric generator, the thermal fluid reservoir comprising a heat transfer fluid.

14. The energy generation system of claim 13, wherein the thermal fluid reservoir is directly coupled to the combustion chamber.

15. The energy generation system of claim 13, wherein the thermal fluid reservoir is thermally coupled to the thermoelectric generator by at least one high temperature heat pipe.

16. The energy generation system of claim 15, further comprising a heat spreader positioned between the at least one high temperature heat pipe and the thermoelectric generator to evenly spread heat from the least one high temperature heat pipe to the thermoelectric generator.

17. The energy generation system of claim 13, wherein the thermal fluid reservoir is directly coupled to a face of the thermoelectric generator.

18. The energy generation system of claim 13, further comprising a heat sink thermally coupled to the thermoelectric generator for dissipating heat from the thermoelectric generator.

19. The energy generation system of claim 18, wherein the combustion chamber, the thermal fluid reservoir, the thermoelectric generator and the heat sink are vertically stacked.

20. An energy generation system, comprising:
- a plurality of energy generation modules configured to be mounted within a framework and structured to be stackable within the framework;
- a thermal recuperator to pre-heat incoming combustible fuel for use with the plurality of energy generation modules;
- a central burning chamber for use with the plurality of energy generation modules, the central burning chamber being vertically oriented with respect to a vertical axis above the plurality of energy generation modules; and
- each energy generation module of the plurality of energy generation modules comprising:
  - a thermoelectric generator configured to convert thermal energy into electricity; and
  - a DC to AC converter coupled to the thermoelectric generator to produce an AC electrical output for residential use;
- wherein the central burning chamber is thermally coupled to the thermoelectric generator, the central burning chamber having a fuel inlet and an exhaust outlet.

21. The energy generation system of claim 20, wherein, for each energy generation module of the plurality of energy generation modules, the thermal recuperator cools an exhaust sufficiently to allow the energy generation system to be placed nearby a residence without a need for additional cooling of the exhaust to prevent heating of an exterior of the residence.

22. The energy generation system of claim 20, wherein, for each energy generation module of the plurality of energy generation modules, the thermal recuperator cools an exhaust sufficiently to allow the energy generation system to be placed within a room of a residence without a need for additional cooling of the exhaust to prevent excessive heating of the room.

23. The energy generation system of claim 20, each energy generation module for of the plurality of energy generation modules further comprising a CO2 recovery device coupled to the exhaust outlet to reduce CO2 emissions from the exhaust outlet.

24. The energy generation system of claim 20, wherein the framework is structured to reduce thermal cross talk between the plurality of energy generation modules.

25. The energy generation system of claim 24, wherein the framework includes an insulating material or an aerogel insulating material configured to reduce thermal cross talk between energy generation modules.

* * * * *